United States Patent
Boudet et al.

(10) Patent No.: US 11,378,377 B2
(45) Date of Patent: *Jul. 5, 2022

(54) INFORMATION PROCESSING APPARATUS, NON-TRANSITORY COMPUTER-READABLE STORAGE MEDIUM HAVING STORED THEREIN INFORMATION PROCESSING PROGRAM, INFORMATION PROCESSING SYSTEM, AND INFORMATION PROCESSING METHOD

(71) Applicant: NINTENDO CO., LTD., Kyoto (JP)

(72) Inventors: Janos Boudet, Paris (FR); François-Xavier Pasquier, Paris (FR); Gilles Pouliquen, Paris (FR); Toshiki Oizumi, Kyoto (JP); Shinji Takenaka, Kyoto (JP)

(73) Assignee: Nintendo Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/231,109

(22) Filed: Apr. 15, 2021

(65) Prior Publication Data

US 2021/0231427 A1  Jul. 29, 2021

Related U.S. Application Data

(63) Continuation of application No. 16/429,283, filed on Jun. 3, 2019, now Pat. No. 11,009,334.

(30) Foreign Application Priority Data

Sep. 14, 2018  (JP) .............................. JP2018-172478

(51) Int. Cl.
*G01B 5/004* (2006.01)
*H03M 7/30* (2006.01)
*G01B 21/00* (2006.01)
*G01P 15/00* (2006.01)
*G01C 21/16* (2006.01)
(Continued)

(52) U.S. Cl.
CPC .............. *G01B 5/004* (2013.01); *H03M 7/30* (2013.01); *A63F 13/21* (2014.09); *A63F 13/211* (2014.09);
(Continued)

(58) Field of Classification Search
CPC .......... G01B 5/004; H03M 7/30; H04W 4/38; A63F 13/21; A63F 13/211; A63F 13/23;
(Continued)

(56) References Cited

U.S. PATENT DOCUMENTS 11,009,334 B2 *  5/2021  Boudet ................. H04W 4/026
2006/0195464 A1   8/2006  Guo
(Continued)

FOREIGN PATENT DOCUMENTS

| JP | 2011-192198 | 9/2011 |
| JP | 5122036 | 1/2013 |
| JP | 2018-084854 | 5/2018 |

OTHER PUBLICATIONS

Extended European Search Report dated Jul. 12, 2019 issued in European Application No. 19161080.7 (7 pgs.).

*Primary Examiner* — Ly D Pham
(74) *Attorney, Agent, or Firm* — Nixon & Vanderhye PC

(57) ABSTRACT

An example of a controller calculates the orientation of the controller based on an output from an inertial sensor, and when a value representing the calculated orientation satisfies a first condition, compresses data in a mode 2, and when the first condition is not satisfied, but a second condition is satisfied, compresses the data in a mode 1, and when the second condition is not satisfied, compresses the data in a mode 0. Then, the controller transmits the compressed data to another apparatus.

20 Claims, 10 Drawing Sheets

(51) Int. Cl.
  *G01C 19/00*    (2013.01)
  *A63F 13/23*    (2014.01)
  *A63F 13/211*   (2014.01)
  *H04W 4/38*     (2018.01)
  *G01P 21/00*    (2006.01)
  *A63F 13/21*    (2014.01)

(52) U.S. Cl.
  CPC .............. *A63F 13/23* (2014.09); *G01C 19/00* (2013.01); *G01C 21/16* (2013.01); *G01P 15/00* (2013.01); *G01P 21/00* (2013.01); *H04W 4/38* (2018.02)

(58) Field of Classification Search
  CPC ......... G01C 19/00; G01C 21/16; G01P 15/00; G01P 21/00
  USPC ....................................................... 702/150
  See application file for complete search history.

(56) References Cited

U.S. PATENT DOCUMENTS

| | | | |
|---|---|---|---|
| 2011/0172015 A1* | 7/2011 | Ikeda | A63F 13/22 463/37 |
| 2013/0314339 A1 | 11/2013 | Ueki et al. | |
| 2016/0065241 A1 | 3/2016 | Ichien | |
| 2016/0335911 A1 | 11/2016 | Nakajo et al. | |
| 2018/0144621 A1 | 5/2018 | Arai et al. | |
| 2019/0197876 A1 | 6/2019 | Mullins | |
| 2020/0088504 A1 | 3/2020 | Boudet et al. | |

* cited by examiner

F I G. 5

| MODE | CONDITION | STATE OF CONTROLLER | DATA SIZE |
|---|---|---|---|
| MODE 2 | (FIRST CONDITIONS)<br>(A) $f2-f0$ < PREDETERMINED VALUE<br>(B) $\Delta f1$ < PREDETERMINED VALUE | STATE WHERE CONTROLLER IS AT REST | $f2$ : 24 BITS<br>$\Delta f0$ : 13 BITS<br>$\Delta f1$ : 4 BITS |
| MODE 1 | (SECOND CONDITIONS)<br>(A) : LARGEST COMPONENT OF $f1$ AND SAME COMPONENTS OF $f0$ AND $f2$ AS LARGEST COMPONENTS OF $f1$ ARE GREATER THAN PREDETERMINED VALUE<br>(B) $\Delta f1$ IS WITHIN PREDETERMINED VALUE | STATE WHERE ORIENTATION LINEARLY CHANGES (ORIENTATION DOES NOT SHARPLY CHANGE) | $f2$ : 16 BITS<br>$f0$ : 16 BITS<br>$\Delta f1$ : 8 BITS |
| MODE 0 | NEITHER MODE 1 NOR 2 IS SELECTED | ANY STATE | $f2$ : 13 BITS<br>$f1$ : 13 BITS<br>$f0$ : 13 BITS |

F I G. 6

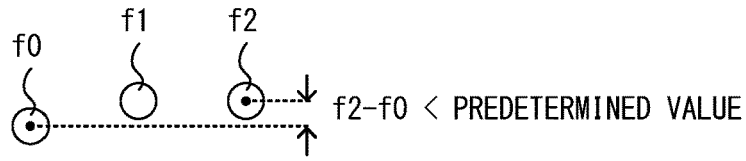

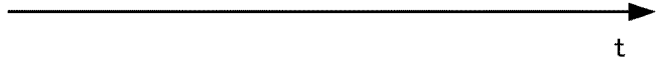

F I G. 7

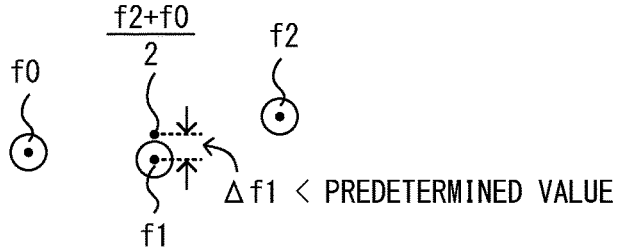

F I G. 8 A
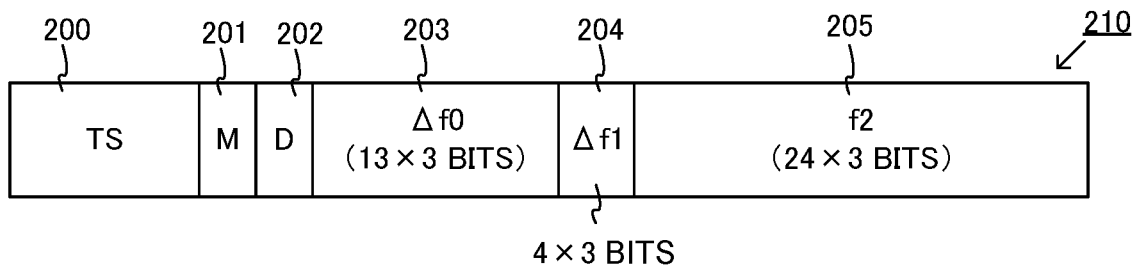
F I G. 8 B
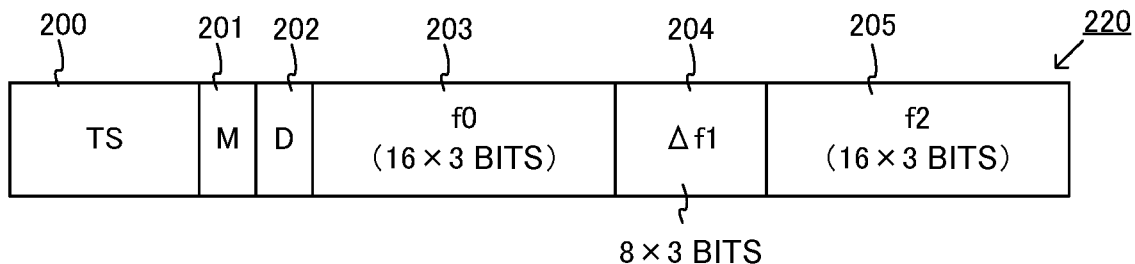
F I G. 8 C
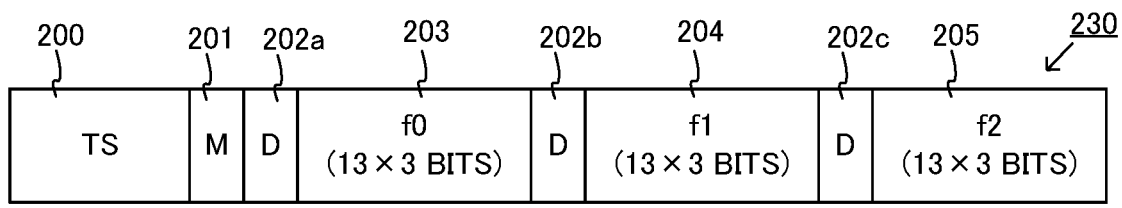

INFORMATION PROCESSING APPARATUS, NON-TRANSITORY COMPUTER-READABLE STORAGE MEDIUM HAVING STORED THEREIN INFORMATION PROCESSING PROGRAM, INFORMATION PROCESSING SYSTEM, AND INFORMATION PROCESSING METHOD

CROSS REFERENCE TO RELATED APPLICATION

This application is a continuation of application Ser. No. 16/429,283 filed on Jun. 3, 2019, which claims priority to Japanese Patent Application No. 2018-172478 filed on Sep. 14, 2018, the entire contents of each of which are hereby incorporated by reference in this application.

FIELD

The present disclosure relates to an information processing apparatus including a sensor, a non-transitory computer-readable storage medium having stored therein an information processing program, an information processing system, and an information processing method.

BACKGROUND AND SUMMARY

For example, as the background art, there is an apparatus including a sensor and for compressing data from the sensor and transmitting the data to another apparatus.

However, there is room for improvement in a method in which an apparatus including a sensor compresses data detected by the sensor, in view of the maintenance of the accuracy of data when the compressed data is restored.

Therefore, it is an object of an exemplary embodiment to provide an information processing apparatus capable of, when compressing and restoring data based on an output from a sensor, maintaining the accuracy of data.

To achieve the above object, the exemplary embodiment employs the following configurations.

An information processing apparatus according to an aspect of the exemplary embodiment is an information processing apparatus including an inertial sensor, the information processing apparatus including at least one processor configured to: based on an output from the inertial sensor at a first timing, acquire a first value regarding an orientation or a position of the information processing apparatus; based on an output from the inertial sensor at a second timing different from the first timing, acquire a second value regarding the orientation or the position of the information processing apparatus; based on at least one of the first value and the second value, determine whether or not a first condition is satisfied; when it is determined that the first condition is satisfied, compress at least one of the first value and the second value by a first method, thereby generating first compressed data including data related to the first value and data related to the second value; and when it is determined that the first condition is not satisfied, compress at least one of the first value and the second value by a second method different from the first method, thereby generating second compressed data including data related to the first value and data related to the second value.

Based on the above, based on a value regarding the orientation or the position of an apparatus, it is possible to determine whether or not a first condition is satisfied. When the first condition is satisfied, it is possible to compress data by a first method, and when the first condition is not satisfied, it is possible to compress the data by a second method. Consequently, in accordance with the state of an information processing apparatus, it is possible to select a compression method appropriate for maintaining the accuracy of data.

In another aspect, the at least one processor may further configured to transmit the first compressed data or the second compressed data to another apparatus.

Based on the above, it is possible to transmit the compressed data to another apparatus, and another apparatus can restore the data.

In another aspect, based on at least a difference between the first value and the second value, it may be determined whether or not the first condition is satisfied.

Based on the above, based on the difference between a first value and a second value, it is possible to determine whether or not the first condition is satisfied.

In another aspect, the at least one processor may be further configured to, based on an output from the inertial sensor at a third timing different from the first timing and the second timing, acquire a third value regarding the orientation or the position of the information processing apparatus. Based on a difference between an average of the first value and the second value, and the third value, it may be determined whether or not the first condition is satisfied.

Based on the above, it is possible to calculate the difference between the average of a first value and a second value, and a third value, and based on the difference, determine whether or not the first condition is satisfied.

In another aspect, as the determination of whether or not the first condition is satisfied, it may be determined whether or not the information processing apparatus is in a state where the information processing apparatus is at rest.

Based on the above, when the information processing apparatus is in the state where the information processing apparatus is at rest, it is possible to compress the data by the first method.

In another aspect, as the determination of whether or not the first condition is satisfied, it may be determined whether or not an amount of change in the orientation or the position of the information processing apparatus is less than a predetermined value.

Based on the above, when the amount of change in the orientation or the position of the information processing apparatus is less than a predetermined value, it is possible to compress the data by the first method.

In another aspect, as the first method, the first compressed data may be generated so that an amount of either one of the data related to the first value and the data related to the second value is greater than an amount of the other.

Based on the above, the first compressed data is generated so that the amount of one of pieces of data is greater than the amount of the other. Thus, it is possible to make the amount of information to be lost regarding data of one of pieces of data. Thus, it is possible to maintain the accuracy of data when the data is compressed.

In another aspect, the at least one processor may be further configured to, based on an output from the inertial sensor at a third timing different from the first timing and the second timing, acquire a third value regarding the orientation or the position of the information processing apparatus. Data related to the third value set based on the first value, the second value, and the third value may be compressed, thereby generating the first compressed data further including the compressed data related to the third value.

Based on the above, based on a first value and a second value, it is possible to compress data related to a third value.

In another aspect, as the first method, the data related to the first value and the data related to the second value may be compressed so that an amount of the data related to the second value is greater than an amount of the data related to the first value, and the data related to the third value is further compressed so that the amount of the data related to the third value is smaller than the amount of the data related to the first value, thereby generating the first compressed data including the compressed data related to the first value, the compressed data related to the second value, and the compressed data related to the third value.

Based on the above, the amounts of data of pieces of data related to three values are varied, whereby it is possible to make the amount of information to be lost regarding data related to the second value, and it is possible to maintain the accuracy of data.

In another aspect, the second value may be set as the compressed data related to the second value, a difference between the first value and the second value may be set as the compressed data related to the first value, and a difference between an average of the first value and the second value, and the third value may be set as the compressed data related to the third value, thereby generating the first compressed data.

Based on the above, it is possible to compress the data related to the second value, thereby setting the second value as it is as the data related to the second value. Regarding the first value, it is possible to set the difference between the first value and the second value as data related to the first value. Regarding the third value, it is possible to set the difference as data related to the third value. Consequently, it is possible to reduce the amount of data as a whole and also restore the three values.

In another aspect, the at least one processor may be further configured to, when it is determined that the first condition is not satisfied, then at least based on the first value and the second value, determine whether or not a second condition different from the first condition is satisfied. When it is determined that the second condition is satisfied, the second compressed data may be generated.

Based on the above, when it is determined that the first condition is satisfied, it is determined whether or not a second condition is satisfied. When the second condition is satisfied, it is possible to compress the data by the second method. Consequently, in accordance with the state of the apparatus, it is possible to select an appropriate compression method.

In another aspect, as the determination of whether or not the second condition is satisfied, it may be determined whether or not the orientation or the position of the information processing apparatus changes linearly.

Based on the above, when the orientation or the position of the information processing apparatus changes linearly, it is possible to compress the data by the second method.

In another aspect, the at least one processor may be further configured to, based on an output from the inertial sensor at a third timing different from the first timing and the second timing, acquire a third value regarding the orientation or the position of the information processing apparatus. Based on whether or not the first value, the second value, and the third value have linearity, it may be determined whether or not the second condition is satisfied.

Based on the above, based on whether or not a first value, a second value, and a third value change linearly, it is possible to determine whether or not the second condition is satisfied.

In another aspect, at least when a difference between an average of the first value and the second value, and the third value is a predetermined range, it may be determined that the second condition is satisfied.

Based on the above, when the difference is within a predetermined range, it is possible to compress the data by the second method.

In another aspect, a component having the largest absolute value among a plurality of components included in any one of the first value, the second value, and the third value may be specified. Regarding the two values other than the one of the first value, the second value, and the third value, components corresponding to the specified component may be compared with a predetermined value, and based on a result of the comparison, it may be determined whether or not the second condition is satisfied.

Based on the above, when each of the first value, the second value, and the third value has a plurality of components, for example, the largest component of the third value is specified, and based on the result of comparing the same components of the first value and the second value as the specified component, and a predetermined value, it is possible to determine whether or not the second condition is satisfied.

In another aspect, as the second method, data related to the third value may be set based on an average of the first value and the second value, and the data related to the third value may be compressed, thereby generating the second compressed data including the compressed data related to the third value.

Based on the above, the value of the third value is not set as it is as data related to the third value, but data is set based on the average of the first value and the second value. Thus, it is possible to make a value to be set as the data related to the third value relatively small.

In another aspect, the at least one processor may be further configured to, based on at least two of the first value, the second value, and the third value, calculate a predetermined reference value. As the second method, data related to at least one of the first value, the second value, and the third value may be set based on the reference value, and the data related to the at least one value may be compressed, thereby generating the second compressed data including the compressed data.

Based on the above, for example, the value of the third value is not set as it is as data related to the third value, but data is set based on a reference value based on the first value and the second value. Thus, it is possible to make a value to be set as the data related to the third value relatively small.

In another aspect, as the second method, as the second method, the data related to the first value, the data related to the second value, and data related to the third value may be compressed so that amounts of the data related to the first value and the data related to the second value are equal to each other, and the amounts of the data related to the first value and the data related to the second value are greater than an amount of the data related to the third value.

Based on the above, the amounts of data when data related to the first value and data related to the second value are compressed are made relatively great, whereby it is possible to make the amount of information to be lost small. Thus, it is possible to maintain the accuracy of data.

In another aspect, the second timing may be a timing after the first timing. The third timing may be a timing between the first timing and the second timing.

Based on the above, it is possible to determine a condition based on information output from an inertial sensor at a first timing, a second timing, and a third timing in this order and compress the data.

In another aspect, the at least one processor may be further configured to, when it is determined that the second condition is not satisfied, compress at least the data related to the first value and the data related to the second value by a third method different from the first method and the second method, thereby generating third compressed data including the data related to the first value and the data related to the second value.

Based on the above, when it is determined that the second condition is not satisfied, it is possible to further compress the data by a third method.

In another aspect, the first value and the second value may be data including a plurality of components, and the plurality of components have a predetermined relationship. The data related to the first value and the data related to the second value may be data obtained by omitting at least one of the plurality of components. The third compressed data may include information indicating the component omitted from the data related to the first value and information indicating the component omitted from the data related to the second value.

Based on the above, in the compression by the third method, it is possible to vary components to be omitted between a first value and a second value.

In another aspect, the at least one processor is further configured to: based on the output from the inertial sensor at the first timing, calculate the first value representing the orientation or the position of the apparatus; based on the output from the inertial sensor at the second timing, calculate the second value representing the orientation or the position of the apparatus; and transmit data including the first value and the second value to another apparatus.

Based on the above, based on an output from an inertial sensor, the information processing apparatus can calculate a value representing the orientation or the position of the apparatus, compress the value, and transmit the value to another apparatus.

Further, an information processing apparatus according to another exemplary embodiment is an information processing apparatus including an inertial sensor, the information processing apparatus including first acquisition means, second acquisition means, and data compression means. Based on an output from the inertial sensor at a first timing, the first acquisition means acquires a first value regarding an orientation or a position of the information processing apparatus. Based on an output from the inertial sensor at a second timing different from the first timing, the second acquisition means acquires a second value regarding the orientation or the position of the information processing apparatus. The data compression means compresses at least one of data related to the first value and data related to the second value so that an amount of either one of the data related to the first value and the data related to the second value is greater than an amount of the other.

Based on the above, data is compressed so that the amount of either one of data related to a first value and data related to a second value is greater than the amount of the other. Thus, it is possible to make the amount of information to be lost in one of pieces of data. Thus, it is possible to maintain the accuracy of data.

An information processing apparatus according to another exemplary embodiment is an information processing apparatus including an inertial sensor, the information processing apparatus including first calculation means, second calculation means, and transmission means. Based on an output from the inertial sensor at a first timing, the first calculation means calculates a first value representing an orientation or a position of the apparatus. Based on an output from the inertial sensor at a second timing different from the first timing, the second calculation means calculates a second value representing the orientation or the position of the apparatus. The transmission means transmits data including the first value and the second value to another apparatus.

Based on the above, an apparatus can calculate a value representing the orientation or the position of the apparatus based on an output from an inertial sensor and transmit the value to another apparatus. Consequently, another apparatus can accurately recognize the orientation of the information processing apparatus.

In another aspect, the information processing apparatus may further include compression means for compressing at least one of the first value and the second value. The transmission means may transmit the data compressed by the compression means to the other apparatus.

Based on the above, the information processing apparatus can compress at least one of a first value and a second value and transmit the compressed value to another apparatus.

In another aspect, the transmission means may transmit the data including time information regarding the first timing or the second timing to the other apparatus.

Based on the above, it is possible to further transmit time information to another apparatus.

In another aspect, the first value and the second value may be quaternions representing the orientation of the information processing apparatus.

Based on the above, the information processing apparatus can calculate a quaternion representing the orientation and transmit the quaternion to another apparatus.

In another aspect, the information processing apparatus may further include determination means, first data compression means, and second data compression means. Based on at least one of the first value and the second value, the determination means may determine whether or not a first condition is satisfied. When the determination means determines that the first condition is satisfied, the first data compression means may compress at least one of the first value and the second value by a first method, thereby generating first compressed data including data related to the first value and data related to the second value. When the determination means determines that the first condition is not satisfied, the second data compression means may compress at least one of the first value and the second value by a second method different from the first method, thereby generating second compressed data including the data related to the first value and the data related to the second value.

Based on the above, in accordance with the state of the information processing apparatus, it is possible to select an appropriate compression method.

Further, another exemplary embodiment may be a program executed by the information processing apparatus, an information processing method, or an information processing system including the above information processing apparatus and another apparatus.

According to the exemplary embodiment, when data from a sensor is compressed and restored, it is possible to maintain the accuracy of data.

These and other objects, features, aspects and advantages of the exemplary embodiments will become more apparent from the following detailed description of the exemplary embodiments when taken in conjunction with the accompanying drawings.

BRIEF DESCRIPTION OF THE DRAWINGS

FIG. 5 is a diagram showing examples of a plurality of example non-limiting modes;

FIG. 6 is an example non-limiting diagram conceptually representing formula 4;

FIG. 7 is an example non-limiting diagram conceptually representing a first condition B;

FIG. 8A is an example non-limiting diagram showing an example of the data structure of first compressed data generated when a mode 2 is selected;

FIG. 8B is an example non-limiting diagram showing an example of the data structure of second compressed data generated when a mode 1 is selected;

FIG. 8C is an example non-limiting diagram showing an example of the data structure of third compressed data generated when a mode 0 is selected;

DETAILED DESCRIPTION OF NON-LIMITING EXAMPLE EMBODIMENTS

An information processing system according to an example of an exemplary embodiment is described below. An example of an information processing system 1 according to the exemplary embodiment includes a main body apparatus 2, a left controller 3, and a right controller 4.

Figure 1:
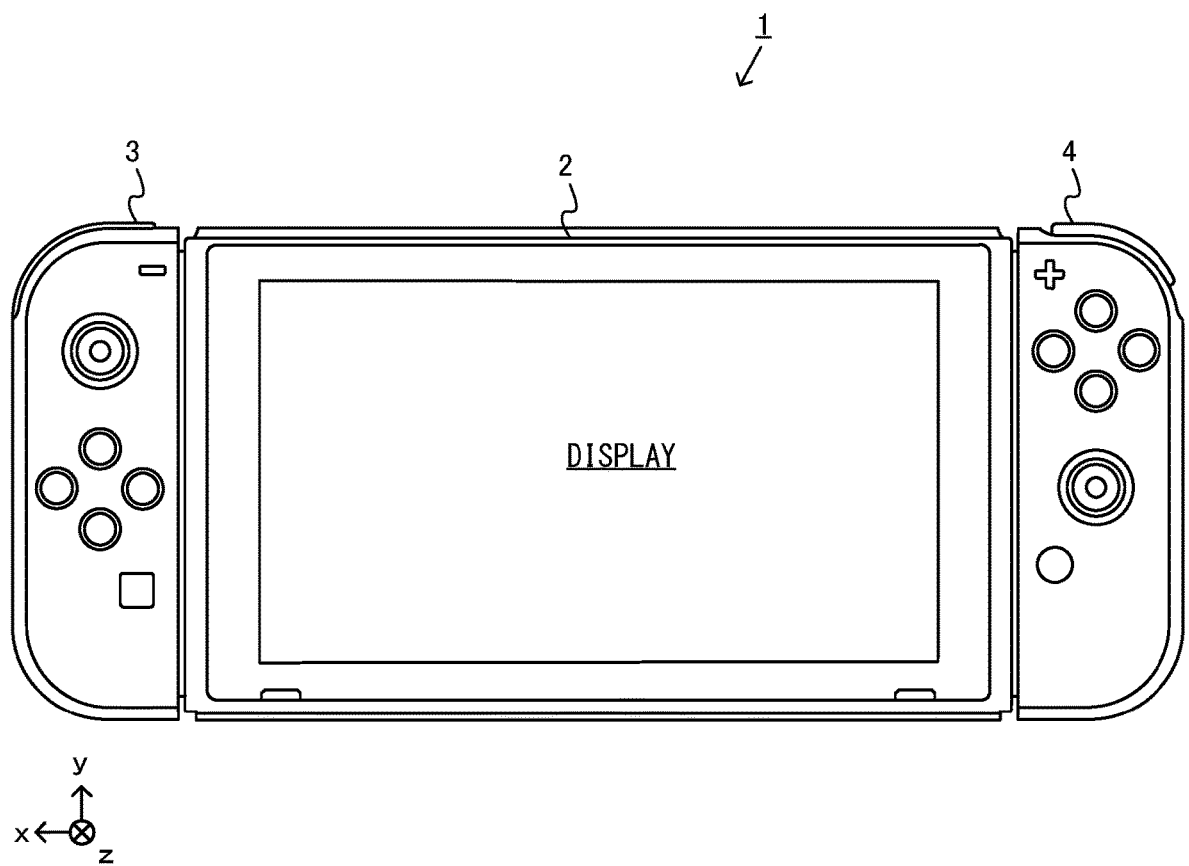
FIG. 1 is a diagram showing an example of the state where an example non-limiting left controller 3 and an example non-limiting right controller 4 are attached to an example non-limiting main body apparatus 2.

FIG. 1 is a diagram showing an example of the state where the left controller 3 and the right controller 4 are attached to the main body apparatus 2. As shown in FIG. 1, each of the left controller 3 and the right controller 4 is attached to and unified with the main body apparatus 2. The main body apparatus 2 is an apparatus for performing various processes (e.g., game processing) in the information processing system 1. The main body apparatus 2 includes a display for displaying an image generated by the main body apparatus 2. Each of the left controller 3 and the right controller 4 is an information processing apparatus including input sections with which a user provides inputs, an inertial sensor for detecting the position or the orientation of the controller, and the like.

Figure 2:
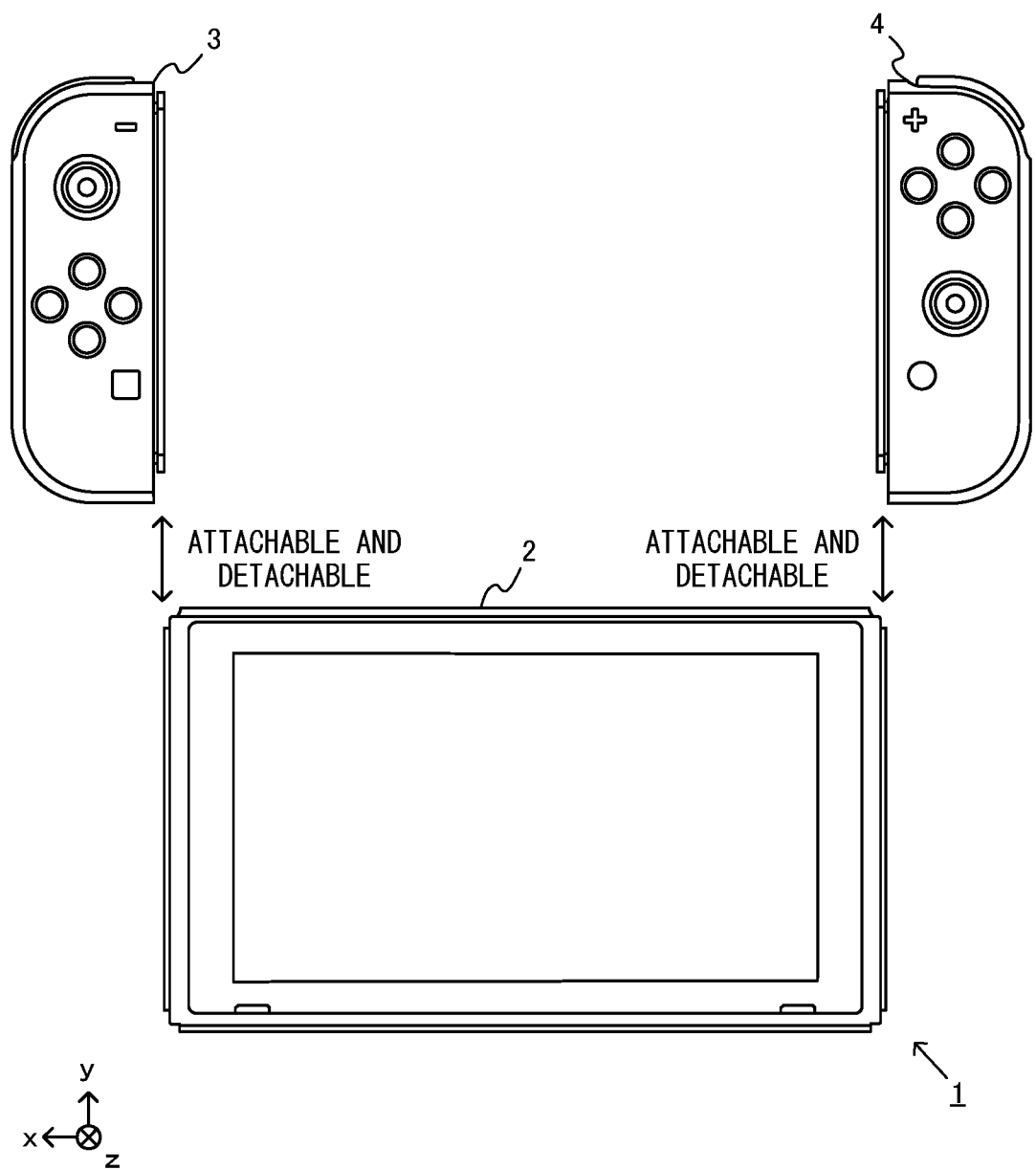
FIG. 2 is a diagram showing an example of the state where each of the example non-limiting left controller 3 and the example non-limiting right controller 4 is detached from the example non-limiting main body apparatus 2.

FIG. 2 is a diagram showing an example of the state where each of the left controller 3 and the right controller 4 is detached from the main body apparatus 2. As shown in FIGS. 1 and 2, the left controller 3 and the right controller 4 are attachable to and detachable from the main body apparatus 2. It should be noted that hereinafter, the left controller 3 and the right controller 4 will occasionally be referred to collectively as a "controller".

Figure 3:
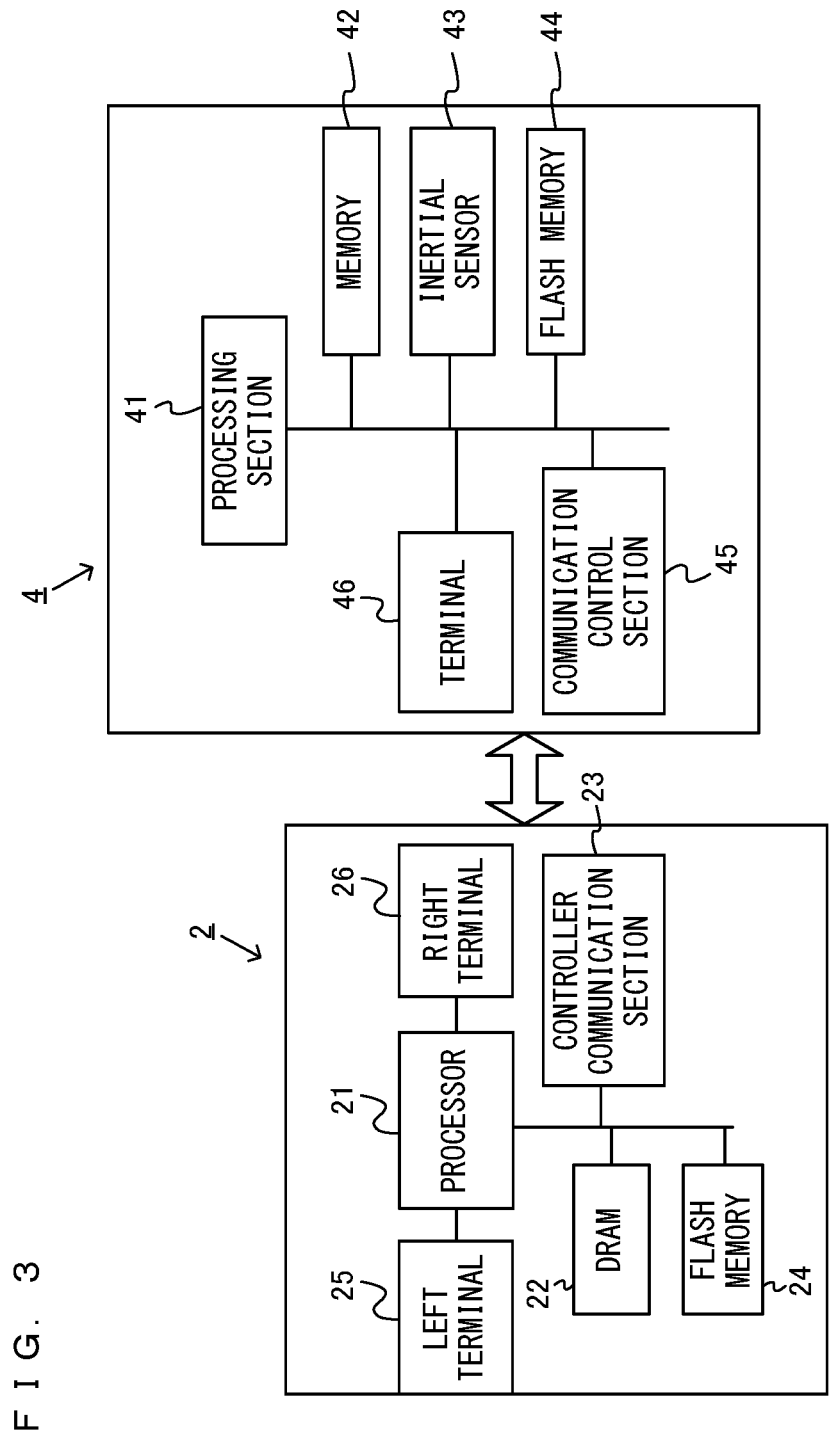
FIG. 3 is a block diagram showing an example of the internal configurations of the example non-limiting main body apparatus 2 and the example non-limiting right controller 4.

FIG. 3 is a block diagram showing an example of the internal configurations of the main body apparatus 2 and the right controller 4. It should be noted that FIG. 3 shows only portions regarding the transmission of orientation data of the right controller 4, and other portions are omitted. Further, hereinafter, only the configuration of the right controller 4 will be described, and the configuration of the left controller 3 will be omitted. The configuration of the left controller 3, however, is similar to that of the right controller 4.

As shown in FIG. 3, the main body apparatus 2 includes a processor 21, a DRAM 22, a controller communication section 23 for the main body apparatus 2 to communicate with the controller, and a flash memory 24. Further, the main body apparatus 2 includes a left terminal 25 for performing wired communication with the left controller 3, and a right terminal 26 for performing wired communication with the right controller 4. Further, although not shown in the figures, the main body apparatus 2 includes a battery. The processor 21 is an information processing section for executing various types of information processing to be executed by the main body apparatus 2. For example, the processor 21 may be composed only of a CPU (Central Processing Unit), or may be composed of a SoC (System-on-a-chip) having a plurality of functions such as a CPU function and a GPU (Graphics Processing Unit) function. The processor 21 executes a program (e.g., a game program) stored in a storage section (specifically, an internal storage medium such as a flash memory 24, an external storage medium attached to a slot of the main body apparatus 2, or the like), thereby performing the various types of information processing.

The controller communication section 23 performs wireless communication compliant with, for example, the Bluetooth (registered trademark) standard with the right controller 4. Similarly, the controller communication section 23 performs communication compliant with, for example, the Bluetooth (registered trademark) standard with the left controller 3. It should be noted that the main body apparatus 2 may perform wireless communication with the controller in accordance with another standard (e.g., a wireless LAN).

In the state where each of the left controller 3 and the right controller 4 is detached from the main body apparatus 2, the main body apparatus 2 performs wireless communication with the left controller 3 and the right controller 4 via the controller communication section 23. For example, the main body apparatus 2 receives orientation data (described later) from the left controller 3 and/or the right controller 4 and performs various processes based on the received orientation data (e.g., the control of the orientation of a virtual camera for displaying a game image).

As shown in FIG. 3, the right controller 4 includes a processing section 41, a memory 42, an inertial sensor 43, a flash memory 44, a communication control section 45, and a terminal 46. It should be noted that the right controller 4 includes input sections such as a plurality of buttons, an analog stick (see FIG. 1), and the like in addition to these components.

The processing section 41 is connected to the memory 42, the inertial sensor 43, the flash memory 44, the communication control section 45, and the terminal 46 via a bus. Although the details will be described later, the processing section 41 calculates the orientation of the right controller 4 based on an output from the inertial sensor 43.

Further, the flash memory 44 stores firmware for controlling the right controller 4, a control program for calculating orientation data described later, and the like.

The communication control section 45 can communicate with the main body apparatus 2 through both wired communication via the terminal 46 and wireless communication not via the terminal 46. That is, as shown in FIG. 1, when the right controller 4 is attached to the main body apparatus 2, the communication control section 45 communicates with the main body apparatus 2 via the terminal 46. Further, as shown in FIG. 2, when the right controller 4 is detached from the main body apparatus 2, the communication control section 45 wirelessly communicates with the main body apparatus 2 (specifically, the controller communication section 23).

For example, when the right controller 4 is not attached to the main body apparatus 2 as shown in FIG. 2, orientation data representing the orientation of the right controller 4 calculated by the processing section 41 is transmitted to the main body apparatus 2 through wireless communication. Alternatively, when the right controller 4 is attached to the main body apparatus 2 as shown in FIG. 1, the orientation data is transmitted to the main body apparatus 2 via the terminal 46 through wired communication. Further, the communication control section 45 acquires operation information from each input section (specifically, each button, an analog stick, or the like) and transmits operation data including the acquired information (or information obtained by performing predetermined processing on the acquired information) to the main body apparatus 2.

The communication between the main body apparatus 2 and the right controller 4 is repeatedly performed once every predetermined time. While the communication between the main body apparatus 2 and the right controller 4 is performed once, operation data corresponding to an operation on each input section and orientation data corresponding to an output from the inertial sensor 43 are transmitted from the right controller 4 to the main body apparatus 2. It should be noted that the operation data and the orientation data may be transmitted at different timings. For example, at a certain timing in the communication between the main body apparatus 2 and the right controller 4, either one of the operation data and the orientation data is transmitted from the right controller 4 to the main body apparatus 2, and at another timing in the communication, the other data may be transmitted from the right controller 4 to the main body apparatus 2.

The inertial sensor 43 is, for example, a six-axis sensor. Specifically, the inertial sensor 43 includes an acceleration sensor and an angular velocity sensor. The acceleration sensor detects the magnitudes of accelerations along predetermined three axial (e.g., xyz axes shown in FIG. 1) directions. The angular velocity sensor detects angular velocities about predetermined three axes (e.g., the xyz axes shown in FIG. 1). The processing section 41 calculates the orientation of the right controller 4 based on the angular velocity values from the inertial sensor 43. Orientation data corresponding to the calculated orientation is compressed and transmitted to the main body apparatus 2. It should be noted that the processing section 41 calculates the orientation of the controller based on the acceleration values in addition to the angular velocity values from the inertial sensor 43.

It should be noted that the configurations shown in FIG. 3 are merely examples, and the physical configurations may be different from the configurations shown in FIG. 3. For example, the communication control section 45, the processing section 41, and the memory 42 may be formed in an integrated manner. Further, the controller and/or the main body apparatus 2 may include another device, another sensor, or another apparatus. Further, in FIG. 3, the controller includes the inertial sensor 43 including the acceleration sensor and the angular velocity sensor. Alternatively, the acceleration sensor and the angular velocity sensor may be separate sensors.

(Transmission of Orientation Data to Main Body Apparatus 2)

Figure 4:
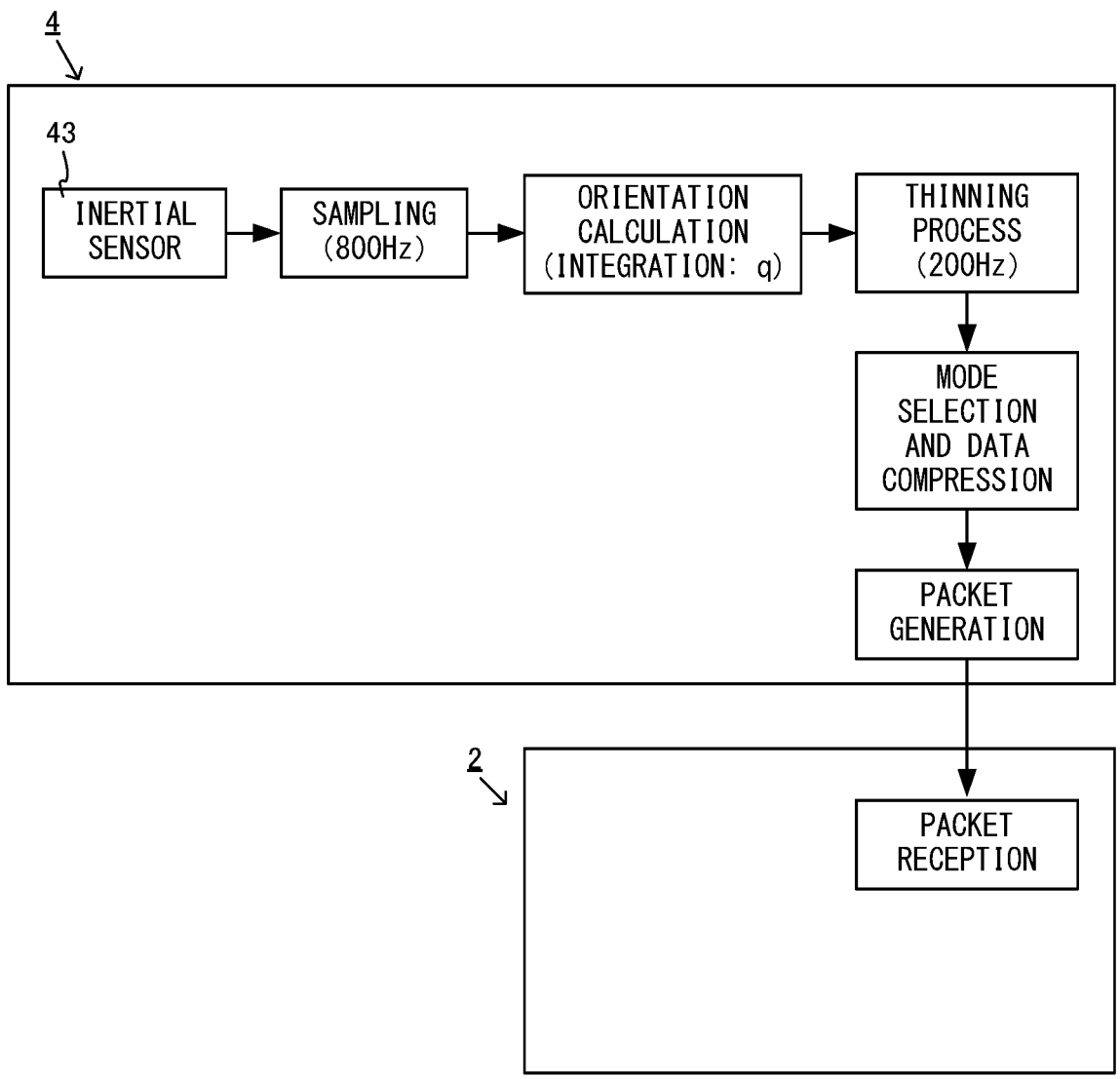
FIG. 4 is a diagram showing the flow of processing performed when orientation data is transmitted from the example non-limiting right controller 4 to the example non-limiting main body apparatus 2.

Next, a description is given of processing in a case where the controller calculates orientation data and transmits the calculated orientation data to the main body apparatus 2. FIG. 4 is a diagram showing the flow of processing when orientation data is transmitted from the right controller 4 to the main body apparatus 2.

As shown in FIG. 4, first, the acceleration values and the angular velocity values from the inertial sensor 43 are sampled at a predetermined frequency. For example, the sampling frequency of the acceleration values and the angular velocity values may be 800 Hz. Next, based on the sampled angular velocity values, the orientation of the right controller 4 is calculated. Specifically, the angular velocity values output from the inertial sensor 43 are integrated, thereby calculating a quaternion "q" representing the orientation of the right controller 4. In this case, the orientation is calculated by the processing section 41.

The quaternion "q" representing the orientation of the controller is represented by the following formula 1, using complex numbers i, j, and k.

$$q = w + xi + yj + zk \quad \text{(formula 1)}$$

Here, i, j, and k satisfy the following relationships.

$$i^2 = j^2 = k^2 = ijk = -1,$$

$$ij = -ji = k, \; jk = -kj = i, \; ki = -ik = j$$

Further, x, y, and z represent the axes of rotation, and w represents the angle of rotation. The quaternion q is regarded as a vector having four components (w, x, y, and z). Here, the norm of q is 1. That is, w, x, y, and z satisfy the following formula 2.

$$w^2 + x^2 + y^2 + z^2 = 1 \quad \text{(formula 2)}$$

Based on formula 2, if three of the four components are transmitted from the controller to the main body apparatus 2, the main body apparatus 2 can restore the remaining one component. Thus, in the exemplary embodiment, one of the four components is omitted, and three of the four components are transmitted from the controller to the main body apparatus 2. In the exemplary embodiment, the component to be omitted is a component having the largest absolute value. Information to be transmitted from the controller to the main body apparatus 2 includes information indicating the omitted component. Consequently, it is possible to reduce the amount of data transmitted from the controller to the main body apparatus 2, and the main body apparatus 2 can also calculate q representing the orientation of the controller from a vector having three components. It should be noted that the component to be omitted among the four components may not be the component having the largest absolute value.

Hereinafter, a quaternion having four components representing the orientation of the controller will be represented as "q". Further, a vector having three components obtained by omitting one of the four components will occasionally be represented as "f". "f" can be said to be orientation data representing the orientation of the controller.

As is clear from formula 2, each of the absolute values of the components w, x, y, and z of the quaternion q is a value equal to or less than "1". In the exemplary embodiment, however, each component of the vector f is represented by an integer. For example, a value obtained by multiplying 10 to the power of n by each component of q is defined as each component of f.

Further, q(t) representing the orientation of the controller at a time t is calculated using the following recurrence relation.

$$q(t)=\tfrac{1}{2}\times q(t-1)*\omega\times\Delta t \quad \text{(formula 3)}$$

Here, ω is the angular velocity values from the inertial sensor 43. Δt is the sampling cycle.

In the exemplary embodiment, each of the components (w, x, y, and z) of the quaternion q calculated by formula 3 is data represented by 32 bits.

If q representing the orientation is calculated, a thinning process is performed. While q is calculated at 800 Hz (i.e., 800 times a second) in the orientation calculation process, q is thinned at, for example, 200 Hz in the thinning process. That is, one of four chronologically successive quaternions q calculated in the orientation calculation process is extracted in the thinning process.

Next, mode selection is performed. The mode selection is the process of selecting in which of a plurality of modes the orientation data is to be compressed and transmitted to the main body apparatus 2. A compression method for compressing the orientation data varies depending on the mode. It should be noted that in the exemplary embodiment, the mode selection is performed in the state where the controller is detached from the main body apparatus 2 (i.e., the state where the controller and the main body apparatus 2 are wirelessly connected together). The mode selection may be performed also in the state where the controller is attached to the main body apparatus 2.

When any of the plurality of modes is selected in the mode selection, the orientation data is compressed in accordance with the selected mode, and a packet including the compressed orientation data is generated by the communication control section 45. Then, the generated packet is wirelessly transmitted to the main body apparatus 2, and the main body apparatus 2 receives the packet. The main body apparatus 2 extracts the compressed orientation data from the received packet, decompresses the data, restores the quaternion q, and performs predetermined information processing based on the restored quaternion q.

(Details of the Modes)

Next, the details of the modes are described. FIG. 5 is a diagram showing examples of the plurality of modes.

As shown in FIG. 5, the plurality of modes include a mode 2, a mode 1, and a mode 0. Based on the three quaternions acquired by the thinning process, it is determined whether or not conditions are satisfied, and in accordance with the result of the determination, a mode is selected. Hereinafter, the three acquired quaternions will be represented as "q0", "q1", and "q2" in the order of acquisition. That is, q acquired based on an output from the inertial sensor 43 at a time t0 is represented as "q0". q acquired based on an output from the inertial sensor 43 at a time t1 after the time t0 is represented as "q1". q acquired based on an output from the inertial sensor 43 at a time t2 after the time t1 is represented as "q2". Further, vectors f represented by three components and corresponding to "q0", "q1", and "q2" are represented as "f0", "f1", and "f2", respectively.

Specifically, first, it is determined whether or not the mode 2 is applicable. When it is determined that the mode 2 is applicable, the mode 2 is selected. When it is determined that the mode 2 is not applicable, it is determined whether or not the mode 1 is applicable. When it is determined that the mode 1 is applicable, the mode 1 is selected. Then, when it is determined that the mode 1 is not applicable, the mode 0 is selected. A description is given below of each mode and a conditions for applying each mode.

(Description of Mode 2)

The mode 2 is a mode selected in the state where the controller is at rest. Here, "the state where the controller is at rest" refers to the state where the angular velocity values detected by the inertial sensor 43 of the controller are "0" or such minute values that the controller can be regarded as being at rest. That is, "the state where the controller is at rest" is the state where at least at this time, the angular velocity values from the inertial sensor 43 indicate "0" or minute values to such an extent that the controller can be regarded as being completely at rest, or being almost at rest.

The mode 2 is selected when first conditions are satisfied. The first conditions are satisfied when the following formula 4 holds and the following formula 5 also holds.

$$f2-f0<\text{predetermined value} \quad \text{(formula 4) (a first condition A)}$$

$$\Delta f1<\text{predetermined value} \quad \text{(formula 5) (a first condition B)}$$

Here, Δf1 is represented by the following formula 6.

$$\Delta f1 = f1 - (f2+f0)/2 \quad \text{(formula 6)}$$

FIG. 6 is a diagram conceptually representing formula 4. That is, one (the first condition A) of the first conditions for selecting the mode 2 is that the difference between f0 and f2 is less than a predetermined value. FIG. 6 represents one component of each of f0, f1, and f2 and indicates that the one component is less than the predetermined value. Actually, each of f0, f1, and f2 is a vector having three components, and "f2−f0" is the difference vector between the vector f2 and the vector f0. Thus, formula 4 indicates that the norm of this difference vector "f2−f0" is less than the predetermined value. When formula 4 (the first condition A) does not hold, the mode 2 is not selected, and it is determined whether or not second conditions for selecting the mode 1 hold. The second conditions will be described later.

When the first condition A (formula 4) holds, then next, it is determined whether or not the first condition B holds. FIG. 7 is a diagram conceptually representing the first condition B. It should be noted that similarly to FIG. 6, FIG. 7 also represents one component of each of f0, f1, and f2. Specifically, the controller calculates the average of f2 and f0 and calculates the difference (the difference vector) between f1 and the average as Δf1. Then, the controller determines whether or not the norm of Δf1 is less than a predetermined value. Here, the predetermined value of the first condition B may be different from or the same as the predetermined value of the first condition A. When it is determined that the first condition A is satisfied and it is also determined that the first condition B is satisfied, the mode 2 is selected.

That the first condition A holds means that the values of the components of f0 and f2 are close to each other. Further, that the first condition B holds means that the sample f1 in the center is not too far from the average of f0 and f2. This means that when the values of the components of the three samples f0, f1, and f2 are plotted on a graph as shown in FIG. 7, the three samples are arranged in an almost straight line in a horizontal direction. That is, when the first condition A holds and the first condition B also holds, then at least during this period, this means the state where the orientation of the controller hardly changes, and this means the state where the controller is at rest.

When the mode 2 is selected, f0, f1, and f2 are compressed, thereby generating first compressed data including this compressed data. FIG. 8A is a diagram showing an example of the data structure of the first compressed data generated when the mode 2 is selected.

As shown in FIG. 8A, first compressed data 210 generated when the mode 2 is selected includes a timestamp (TS) 200, mode information (M) 201, and omission information (D) 202.

The timestamp 200 is time information. The timestamp 200 may be time information when any of the three quaternions q0, q1, and q2 is calculated. Further, the timestamp 200 may be time information when the angular velocity values (the angular velocity values used to calculate any of q0, q1, and q2) are acquired.

The mode information 201 is information indicating in which of the three modes the orientation data is compressed. When the mode 2 is selected, for example, "2" is set as the mode information 201.

Further, the omission information 202 is information indicating which of the four components of the quaternion q is omitted. It should be noted that in the mode 2, the current state is the state where the controller is at rest, and q0, q1, and q2 are not largely far from each other. Thus, the component to be omitted (the component having the largest absolute value) is common to q0, q1, and q2. Thus, in the mode 2, a single piece of omission information 202 common to the three vectors f0, f1, and f2 is included in the first compressed data 210 and transmitted to the main body apparatus 2.

Further, the first compressed data 210 includes an orientation data section 203 for storing $\Delta$f0 (three components), an orientation data section 204 for storing $\Delta$f1 (three components), and an orientation data section 205 for storing f2 (three components).

Specifically, 24 bits are assigned to each component of f2. That is, as described above, each component of q and f is represented by 32-bit data, but each component of f2 is compressed from 32 bits to 24 bits.

Thus, the data size assigned to f2 (the number of bits of the orientation data section 205) is 24 bits×3 components=72 bits. For example, when the absolute value of w is the largest among the four components, namely w, x, y, and z, of q2, w is omitted (i.e., compressed). Thus, 24 bits are assigned to each of the x, y, and z-components, and the values of these three components are transmitted to the main body apparatus 2 as orientation data f2 representing the orientation of the controller.

Further, the difference between f2 and f0 (the difference vector between the vector f2 and the vector f0) is calculated as $\Delta$f0, and 13 bits are assigned to each component of the calculated difference $\Delta$f0. Specifically, 13 bits×3 components=39 bits are assigned to $\Delta$f0. For example, when w is omitted among the four components, namely w, x, y, and z, of q0, 13 bits are assigned to each of the x-component, the y-component, and the z-component of $\Delta$f0. The main body apparatus 2 receives $\Delta$f0 and f2 from the controller, and based on $\Delta$f0 and f2, calculates each component (e.g., the x-component, the y-component, and the z-component) of f0. Then, the main body apparatus 2 calculates the omitted component (e.g., the w-component) of q0 based on the above formula 2, thereby restoring q0.

Further, 4 bits are assigned to each component of $\Delta$f1 calculated based on formula 6. Specifically, 4 bits×3 components=12 bits are assigned to $\Delta$f1. Based on $\Delta$f1, f2, and $\Delta$f0 received from the controller, the main body apparatus 2 calculates each component of f1. Then, based on the three calculated components of f1, the main body apparatus 2 calculates the omitted component, thereby restoring q1.

The total data size of the orientation data sections ($\Delta$f0, $\Delta$f1, and f2) of the first compressed data 210 in the mode 2 shown in FIG. 8A is 13×3+4×3+24×3=123 bits. On the other hand, in a case where each component of the quaternion q is represented by 32 bits, the size of the orientation data when not compressed is 32 bits×3 components×3=288 bits. Thus, although, due to the compression in the mode 2, it is necessary to add the mode information 201 indicating which of the three modes is selected, the mode information 201 is represented by 2 bits. Thus, it is possible to reduce the entire data size as compared with a case where the orientation data is not compressed.

A packet is generated by adding a predetermined header to the first compressed data 210 shown in FIG. 8A and transmitted from the controller to the main body apparatus 2. The main body apparatus 2 receives the packet including the first compressed data 210, restores f0, f1, and f2 from the received vectors $\Delta$f0, $\Delta$f1, and f2, and based on the formula 2 and the omission information 202, further restores q0, q1, and q2.

In the mode 2, more bits are assigned to f2 than to $\Delta$f0 and $\Delta$f1. Thus, it is possible to transmit f2 to the main body apparatus 2 with an amount of information close to f2 before being compressed (32 bits). Thus, it is possible to transmit more accurate information regarding the orientation of the controller to the main body apparatus 2. For example, when f0, f1, and f2 are represented by the same number of bits on the premise that the total amount of data of the orientation data is reduced to equal to or less than the total amount of data by the compression method in the mode 2 (123 bits), each of f0, f1, and f2 is represented by 13 bits as in the mode 0 described later (because 13 bits×3 components×3=117, and 14 bits×3 components×3=126). In this case, since f2 (and also f1 and f0) is compressed from 32 bits to 13 bits, more information is lost. As a result, the main body apparatus 2 cannot accurately restore the orientation of the controller based on the compressed vectors f0, f1, and f2. For example, when a game object is displayed on the main body apparatus 2 so as to match the orientation of the controller, the main body apparatus 2 cannot accurately restore the orientation of the controller even though, actually, the controller is at rest. Thus, the game object may be displayed in a slightly shaking manner. In the compression method in the mode 2, however, since more bits are assigned to f2, it is possible to make the amount of information to be lost when f2 is compressed smaller. Thus, the main body apparatus 2 can restore the orientation of the controller more accurately.

Further, since the mode 2 is selected in the state where the controller is at rest, the value of each component of $\Delta f0$, which is the difference between f2 and f0, is a relatively small value. Thus, it is possible to represent this relatively small value even by a relatively small amount of data (specifically, 13 bits).

Similarly, in the mode 2, f1 is not transmitted as it is to the main body apparatus 2, but $\Delta f1$, which is the difference between f1 and the average of f2 and f0, is transmitted to the main body apparatus 2. Since the mode 2 is selected in the state where the controller is at rest, the value of each component of $\Delta f1$ is a relatively small value. Thus, it is possible to represent this relatively small value even by a relatively small amount of data (specifically, 4 bits).

(Description of Mode 1)

Referring back to FIG. 5, the mode 1 is a mode selected in the state where the orientation of the controller changes linearly (the state where the orientation does not change sharply). Here, the state where the orientation of the controller changes linearly is the state where each component of q0, q1, and q2 increases or decreases at almost the same rate. That is, this state is the state where, for example, in FIG. 7, f0, f1, and f2 are arranged in an almost straight line in an oblique direction.

Specifically, the mode 1 is a mode selected when the second conditions hold in a case where the above first conditions (the first condition A and the first condition B) do not hold. The second conditions hold when a second condition A shown next holds and a second condition B shown next also holds.

That is, one (referred to as a "second condition A") of the second conditions is that the same components of q0 and q2 as the largest component of q1 (the component having the largest absolute value) are greater than a predetermined value. For example, when the largest component of q1 is "x", and the x-components of q0 and q2 are greater than a predetermined value (a predetermined value greater than 0; e.g., "0.5"), the second condition A holds. The second condition A is a condition for guaranteeing that each component of q as a compression target is less than 1. For example, when the largest components of q1, q0, and q2 are x, the w, y, and z-components of q1, q0, and q2 are compression targets (the vectors f1, f0, and f2 having the w, y, and z-components are compression targets). That the largest components of q1, q0, and q2 are greater than the predetermined value means that the remaining components are less than "1" from formula 2. If the largest components of q1, q0, and q2 are 0, the remaining components may be "1" (or in the vicinity of "1"). When "1" or a value in the vicinity of "1" is compressed, the compression accuracy may be low. Thus, here, to guarantee the compression accuracy, it is determined whether or not the second condition A holds. It should be noted that, actually, data to be compressed is not each component of q, but each component of f as an integer obtained from q. Here, however, a description is given on the assumption that a compression target is each component of q. When the second condition A does not hold, the mode 1 is not selected, and the mode 0 is selected.

When it is determined that the second condition A holds, then next, it is determined whether or not a second condition B holds. The second condition B is that each component of $\Delta f1$ calculated by formula 6 can be represented by 8 bits. Specifically, the second condition B is that the value of each component of $\Delta f1$ is within the range of −128 to 127. That each component of $\Delta f1$ can be represented by 8 bits can also mean that each component of $\Delta f1$ is a relatively small value.

This means that regarding each component, the value of the sample f1 in the center is not too far from the average value of f0 and f2. That is, the determination of whether or not the second conditions (the second condition A and the second condition B) hold can be said to be the determination of whether or not f0, f1, and f2 have linearity.

When each component of $\Delta f1$ can be represented by 8 bits, the mode 1 is selected. When the mode 1 is selected, f0, f1, and f2 are compressed by a compression method different from that in the mode 2, thereby generating second compressed data.

FIG. 8B is a diagram showing an example of the data structure of the second compressed data generated when the mode 1 is selected. Similarly to FIG. 8A, second compressed data 220 generated when the mode 1 is selected includes a timestamp 200, mode information 201, and omission information 202. When the mode 1 is selected, for example, "1" is set as the mode information 201.

Further, the second compressed data 220 includes an orientation data section 203 for storing f0 (three components), an orientation data section 204 for storing $\Delta f1$ (three components), and an orientation data section 205 for storing f2 (three components).

Each component of f0 and f2 is compressed from 32 bits to 16 bits. Specifically, in the mode 1, 16 bits×3 components=48 bits are assigned to f2, and 16 bits×3 components=48 bits are also assigned to f0.

Further, regarding f1, the controller compresses each component of $\Delta f1$ calculated based on the above formula 6 from 32 bits to 8 bits. That is, 8 bits×3 components=24 bits are assigned to $\Delta f1$.

As shown in FIG. 8B, also in the mode 1, the second compressed data 220 includes the omission information 202 common to f0, $\Delta f1$, and f2. The mode 1 is the state where the orientation of the controller changes linearly. Thus, the component having the largest absolute value among the four components is common to q0, q1, and q2. Thus, the omission information 202 is common to f0, $\Delta 1$, and f2. Thus, also in the mode 1, similarly to the mode 2, a single piece of omission information 202 common to the three vectors f0, f1, and f2 is transmitted to the main body apparatus 2.

It should be noted that the data size of the orientation data sections (f0, $\Delta f1$, and f2) of the second compressed data 220 in the mode 1 shown in FIG. 8B is 16×3+8×3+16×3=120 bits.

(Description of Mode 0)

Referring back to FIG. 5, the mode 0 is a mode selected when the first conditions (the first condition A and the first condition B) and the second conditions (the second condition A and the second condition B) do not hold. That is, when the mode 2 is not selected and the mode 1 is not selected, either, the mode 0 is selected. The mode 0 is selected when the controller is in any state (e.g., the state where the orientation of the controller changes sharply in a short time). When the mode 0 is selected, f0, f1, and f2 are compressed, thereby generating third compressed data.

FIG. 8C is a diagram showing an example of the data structure of the third compressed data generated when the mode 0 is selected. As shown in FIG. 8C, similarly to the mode 2 and the mode 1, third compressed data 230 when the mode 0 is selected includes a timestamp 200 and mode information 201. When the mode 0 is selected, for example, "0" is set as the mode information 201.

As shown in FIG. 8C, the third compressed data 230 in the mode 0 includes omission information 202a, omission information 202b, and omission information 202c. The omission information 202a is omission information regarding f0 and is information indicating which of the four components of q0 is omitted. For example, when the w-component is omitted among the four components, namely w, x, y, and z, "0" may be stored in the omission information 202a. When the x-component is omitted, "1" may be stored in the omission information 202a. Similarly, the omission information 202b is omission information regarding f1 and is information indicating which of the four components of q1 is omitted. Further, the omission information 202c is omission information regarding f2 and is information indicating which of the four components of q2 is omitted.

The mode 0 is a mode selected when the controller is not at rest, and a change in the orientation of the controller is not linear. The mode 0 is a mode selected, for example, when the orientation of the controller changes sharply. In this case, the largest components of the four components of q0, q1, and q2 may be different from each other. For example, the component having the largest absolute value of q0 may be the x-component, and the component having the largest absolute value of q1 may be the y-component. Thus, when the mode 0 is selected, the largest component (the component having the largest absolute value) of each of f0, f1, and f2 is omitted. Thus, the omission information 202 is set for each of f0, f1, and f2.

When the mode 0 is selected, each component of f0, f1, and f2 is compressed from 32 bits to 13 bits. Specifically, 13 bits×3 components=39 bits are assigned to f0, 13 bits×3 components=39 bits are also assigned to f1, and 13 bits×3 components=39 bits are assigned to f2.

It should be noted that the data size of the orientation data sections (f0, f1, and f2) of the third compressed data 220 in the mode 0 shown in FIG. 8C is 13×3×3=117 bits.

Figure 9:
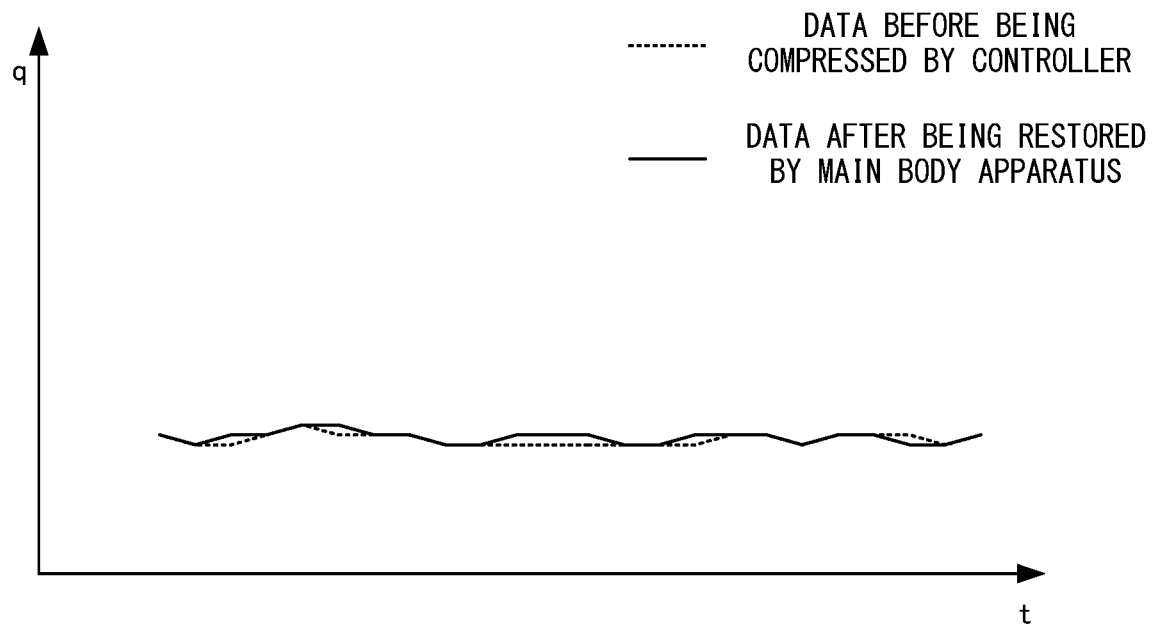
FIG. 9 is an example non-limiting diagram showing the comparison between the orientation data before being compressed when the orientation data is compressed in the mode 2, and the orientation data after the compressed orientation data is transmitted to the main body apparatus and restored in accordance with the main body apparatus.

FIG. 9 is a diagram showing the comparison between the orientation data before being compressed when the orientation data is compressed in the mode 2, and the orientation data after the compressed orientation data is transmitted to the main body apparatus and restored in the main body apparatus.

A dashed line in FIG. 9 indicates the value of the quaternion q (the value of one of the four components of q) before being compressed that is calculated by the controller. Further, a solid line in FIG. 9 indicates the value of the quaternion q (the value of one of the four components of q) after being restored by the main body apparatus 2.

As shown in FIG. 9, even in the state where the controller is at rest, the inertial sensor 43 can slightly detect angular velocities, and the orientation data before being compressed (the dashed line) slightly fluctuates. The orientation data calculated by the controller is compressed in the mode 2 and transmitted to the main body apparatus 2. The main body apparatus 2 restores the compressed orientation data. As shown in FIG. 9, the orientation data after being restored may be slightly shifted from the orientation data before being compressed, but the orientation data after being restored by the main body apparatus 2 almost matches the orientation data before being compressed that is calculated by the controller.

Although not shown in the figures, if the orientation data is compressed in the mode 0 without compressing the orientation data in the mode 2 in the state where the controller is at rest, the shift between the orientation data before being compressed and the orientation data after being restored is greater than the shift shown in FIG. 9.

Further, although not shown in the figures, when the orientation of the controller changes linearly, the shift between the orientation data before being compressed and the orientation data after being restored is smaller when the orientation data is compressed in the mode 1 than when the orientation data is compressed in the mode 0.

As described above, in the exemplary embodiment, the orientation data is compressed by a method that varies depending on the state of the controller. Specifically, the orientation data is compressed by a method that varies depending on the state determined based on data from the inertial sensor 43 of the controller. Consequently, the main body apparatus 2 can accurately restore the orientation data.

(Details of Processing Performed by Controller)

Figure 10:
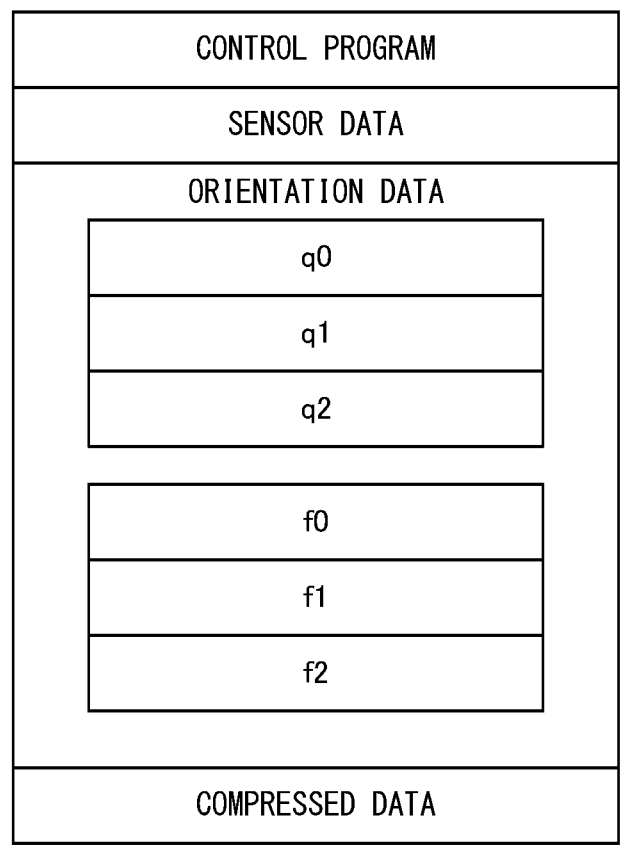
FIG. 10 is a diagram showing an example of example non-limiting data stored in a controller.

Next, the details of processing performed by the controller are described. First, data stored in the controller is described. FIG. 10 is a diagram showing an example of the data stored in the controller.

As shown in FIG. 10, in (the memory 42 or the flash memory 45 of) the controller, a control program, sensor data, orientation data, and compressed data are stored.

The control program includes a program for calculating q representing the orientation of the controller based on an output from the inertial sensor 43, a program for controlling the communication between the controller and the main body apparatus 2, a program for selecting any of the plurality of modes, a program for compressing f in the selected mode, a program for generating the compressed data shown in FIGS. 8A to 8C, a program for transmitting the compressed data to the main body apparatus 2, and the like.

The sensor data is data indicating the angular velocity values about the respective axes output from the inertial sensor 43.

The orientation data is data indicating the quaternion q representing the orientation of the controller calculated based on an output from the inertial sensor 43. The orientation data includes at least three samples (q0, q1, and q2). The quaternion q has four components, namely w, x, y, and z. Further, the orientation data includes a vector f obtained by omitting one of the four components of q and includes f0 corresponding to q0, f1 corresponding to q1, and f2 corresponding to q2.

Further, the compressed data is data after f0, f1, and f2 are compressed, and is data to be transmitted from the controller to the main body apparatus 2. Specifically, the compressed data is the data shown in FIGS. 8A to 8C.

Figure 11:
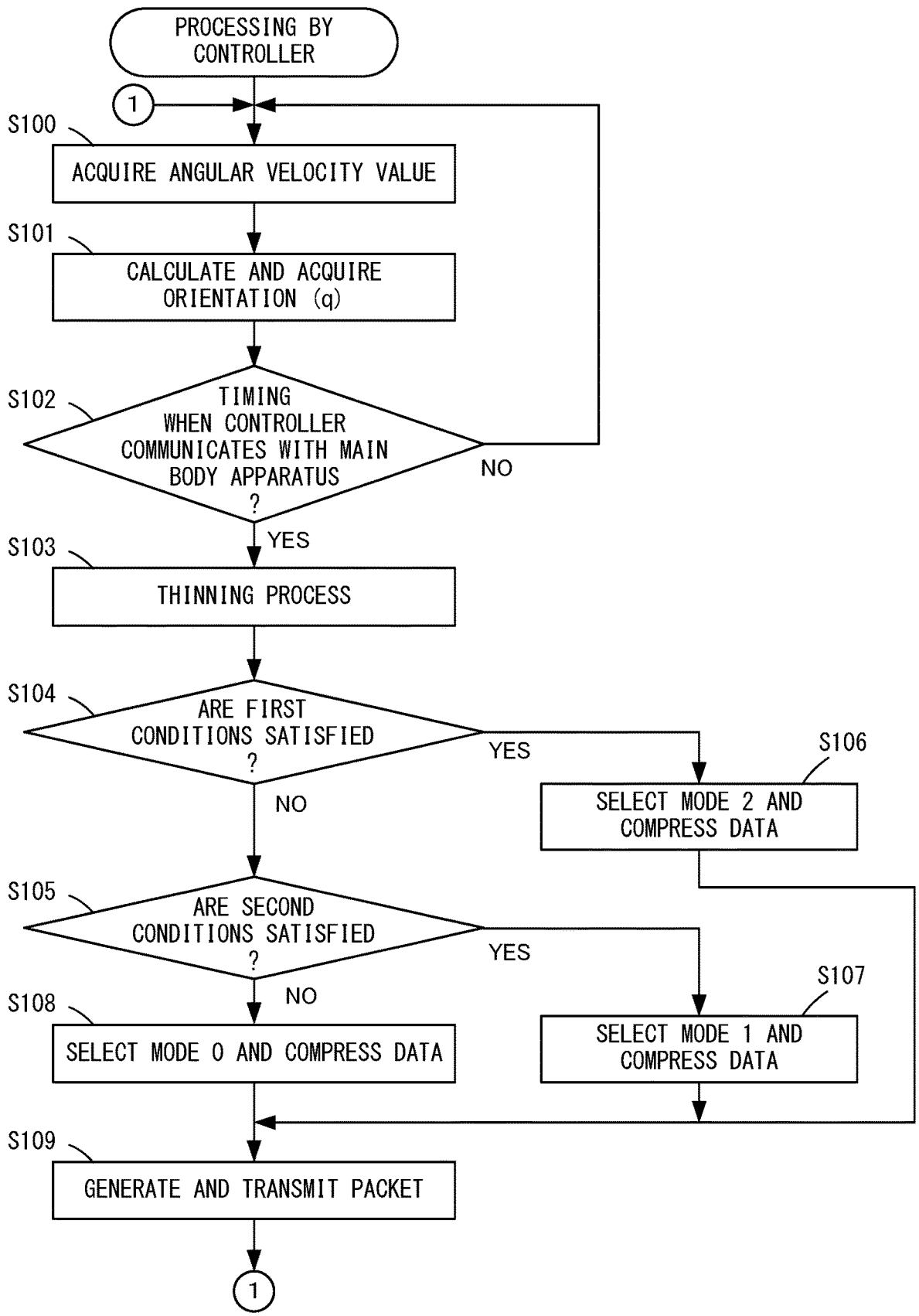
FIG. 11 is a flow chart showing an example of example non-limiting processing performed by the controller.

Next, the details of the processing performed by the controller are specifically described. FIG. 11 is a flow chart showing an example of the processing performed by the controller. The processing shown in FIG. 11 is performed by the processing section 41 of the controller executing the control program. It should be noted that FIG. 11 only shows processes regarding the calculation and the transmission of orientation data. The controller, however, also executes other processes (a process regarding operation data corresponding to an operation on a button or an analog stick, and the like) in addition to these processes.

As shown in FIG. 11, (the processing section 41 of) the controller acquires the angular velocity values about the respective axes from the inertial sensor 43 (step S100). Next, based on the acquired angular velocity values, the controller calculates and acquires the quaternion q representing the orientation of the controller (step S101).

After step S101, the controller determines whether or not the current timing is the timing when the controller communicates with the main body apparatus 2 (step S102). When the current timing is not the timing when the controller communicates with the main body apparatus 2 (step S102: NO), the controller executes the process of step S100 again. In the exemplary embodiment, the processes of steps S100 to S102 are repeatedly performed at 1/800-second intervals. Further, in step S102, when the processes of steps S100 to S102 are performed four times, the determination is YES. That is, in the exemplary embodiment, the acquisition of the angular velocity values from the inertial sensor 43 and the acquisition of "q" representing the orientation are performed at 1/800-second intervals, and the processes of step S103 and after that are repeatedly performed at 1/200-second intervals.

When the determination is YES in step S102, the controller performs a thinning process (step S103). Here, the controller extracts the latest quaternion q calculated in step S101.

After step S103, the controller determines whether or not the first conditions for selecting the mode 2 are satisfied (step S104). In the exemplary embodiment, the first conditions include the first condition A and the first condition B. The first condition A is that the difference between f2 and f0 is less than a predetermined value. Specifically, the controller selects the component having the largest absolute value (e.g., the w-component) among the four components of the quaternion q1 and sets f1 (e.g., a vector having three components, namely x, y, and z) obtained by omitting the largest component. Further, regarding q2 and q0, the controller sets f2 and f0 obtained by omitting the same components (e.g., the w-components). Then, the controller calculates the difference vector between f2 and f0, and as the first condition A, determines whether or not the norm of the difference vector is less than the predetermined value. It should be noted that q2 may be the latest quaternion q calculated in step S101. Further, q1 may be q calculated in step S101 immediately before q2 (i.e., q calculated 1/800 seconds before q2), and q0 may be q calculated in step S101 immediately before q1 (i.e., q calculated 1/800 seconds before q1). Further, q2 may be the latest quaternion q calculated in step S101, q1 may be q extracted in step S103 before q2 (i.e., q calculated 1/200 seconds before q2), and q0 may be q extracted in step S103 before q1 (i.e., q calculated 1/200 seconds before q1).

When it is determined that the first condition A holds, then in step S104, the controller further determines whether or not the first condition B holds. Specifically, the controller calculates the average of f2 and f0 and calculates the difference between f1 and the average as Δf1. Then, as the first condition B, the controller determines whether or not the norm of Δf1 is less than a predetermined value.

When it is determined that the first condition A or the first condition B does not hold (step S104: NO), the controller determines whether or not the second conditions for selecting the mode 1 are satisfied (step S105). Specifically, the controller determines whether or not the second condition A holds. The second condition A is that the same components of q0 and q2 as the largest component (absolute value) of q1 are greater than a predetermined value. For example, when the largest component (absolute value) of q1 is w, the controller determines whether or not the w-components of q0 and q2 are greater than the predetermined value. When it is determined that the second condition A does not hold, the determination is NO in step S105. When, on the other hand, it is determined that the second condition A holds, the controller further determines whether or not the second condition B holds. The second condition B is that Δf1 can be represented by 8 bits (is within the range of −128 to 127). When it is determined that the second condition B holds, the determination is YES in step S105. When it is determined that the second condition B does not hold, the determination is NO in step S105.

When the determination is YES in step S104, the controller selects the mode 2 and compresses orientation data in the selected mode 2 (step S106). Specifically, as described above, the controller compresses each component of f2 to 24 bits, compresses each component of Δf0, which is the difference between f2 and f0, to 13 bits, and compresses each component of Δf1 to 4 bits. Then, the controller generates first compressed data including these pieces of compressed data.

When the determination is YES in step S105, the controller selects the mode 1 and compresses the orientation data in the selected mode 1 (step S107). Specifically, as described above, the controller compresses each component of f2 to 16 bits, compresses each component of f0 to 16 bits, and compresses each component of Δf1 to 8 bits. Then, the controller generates second compressed data including these pieces of compressed data.

When the determination is NO in step S105, the controller selects the mode 0 and compresses the orientation data in the selected mode 0 (step S108). Specifically, as described above, the controller compresses each component of f0 to 13 bits, compresses each component of f1 to 13 bits, and compresses each component of f2 to 13 bits. Further, in step S108, regarding each of q0, q1, and q2, the controller sets the omission information 202a to 202c indicating which component is to be omitted. For example, when it is determined that the x-component is to be omitted regarding q0, the controller sets "1" in the omission information 202a, also sets f0 having three components, namely w, y, and z, and compresses each component of f0 to 13 bits. Further, when it is determined that the y-component is to be omitted regarding q1, the controller sets "2" in the omission information 202b, also sets f1 having three components, namely w, x, and z, and compresses each component of f1 to 13 bits. Further, when it is determined that the z-component is to be omitted regarding q2, the controller sets "3" in the omission information 202c, also sets f2 having three components, namely w, x, and y, and compresses each component of f2 to 13 bits. Then, the controller generates third compressed data including data related to these compressed vectors f0, f1, and f2 and the omission information.

When the process of any of steps S106 to S108 is performed, the controller generates a packet including the compressed data and transmits the generated packet to the main body apparatus 2 (step S109).

(Example of Processing Performed by Main Body Apparatus 2)

Figure 12:
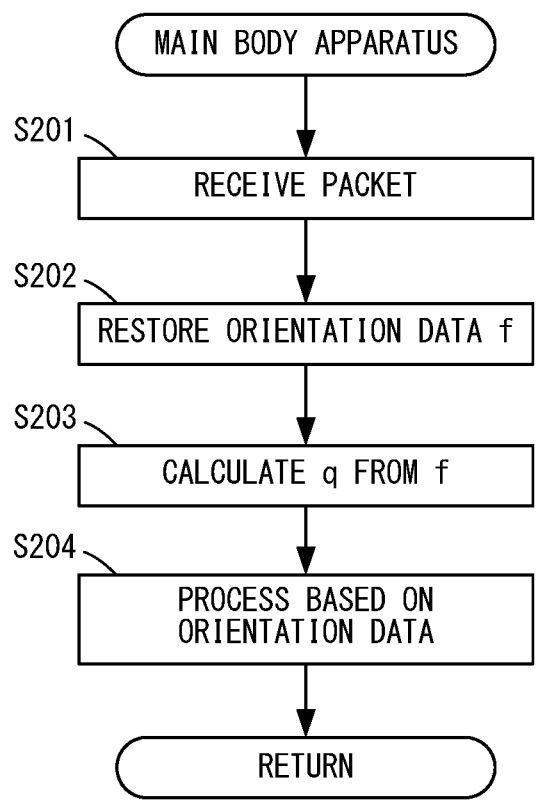
FIG. 12 is a flow chart showing an example of example non-limiting processing performed by the main body apparatus 2.

Next, an example of processing performed by the main body apparatus 2 is described. FIG. 12 is a flow chart showing an example of the processing performed by the main body apparatus 2. It should be noted that the processing shown in FIG. 12 is repeatedly executed at predetermined time intervals (e.g., 1/200-second intervals).

As shown in FIG. 12, the main body apparatus 2 receives the packet from the controller (step S201). If receiving the packet from the controller, the main body apparatus 2 restores the orientation data f from the received packet (step S202). Specifically, based on the mode information 201, the main body apparatus 2 analyzes the received packet and determines in which mode the orientation data f is compressed. Then, the main body apparatus 2 restores the orientation data f0, f1, and f2 by a method corresponding to the mode in which the orientation data f is compressed. For example, when the orientation data f is compressed in the mode 2, the main body apparatus 2 decompresses each component of f2 from 24 bits to 32 bits. Further, in this case, the main body apparatus 2 calculates f0 based on f2 and Δf0 and decompresses each component of f0 to 32 bits. Further, the main body apparatus 2 restores f1 based on f2, f0, and Δf1 and decompresses each component of f1 to 32 bits.

Next, the main body apparatus 2 calculates q from the orientation data f (step S203). Specifically, based on the omission information 202 included in the packet, the main body apparatus 2 determines which component is omitted. Then, the main body apparatus 2 calculates the omitted component and restores the quaternion q. For example, when the orientation data is compressed in the mode 2 or the mode 1, then based on the omission information 202 common to f0, f1, and f2, the main body apparatus 2 calculates the omitted component and restores q0, q1, and q2. Further, when the orientation data is compressed in the mode 0, then based on the omission information 202a corresponding to f0, the main body apparatus 2 calculates the omitted component of f0 and restores q0. Similarly, based on the omission information 202b corresponding to f1, the main body apparatus 2 calculates the omitted component of f1 and restores q1. Further, based on the omission information 202c corresponding to f2, the main body apparatus 2 calculates the omitted component of f2 and restores q2.

Then, the main body apparatus 2 executes a process based on the restored orientation data q (step S204). For example, as the process based on the orientation data q, the process of controlling a virtual camera in a virtual space may be performed. Alternatively, as the process based on the orientation data q, the process of controlling a user object in the virtual space may be performed.

It should be noted that the processes shown in the above flow charts are merely illustrative, and the order and the contents of the processes may be appropriately changed. Further, the values used in each process and determination may be changed.

Figure 13:
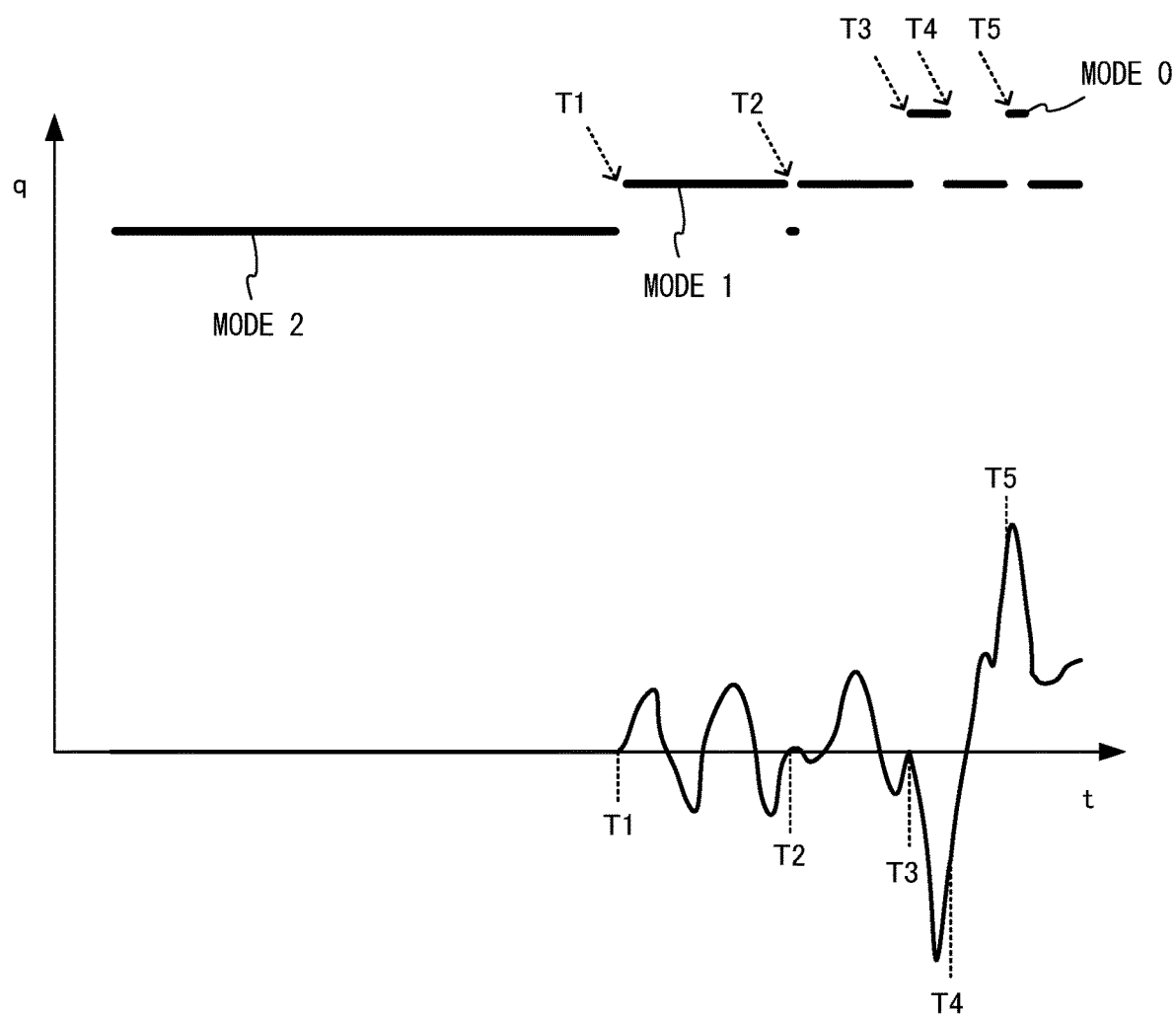
FIG. 13 is an example non-limiting diagram showing examples of changes in the orientation of the controller and modes to be selected.

FIG. 13 is a diagram showing examples of changes in the orientation of the controller and modes to be selected. In FIG. 13, the horizontal axis represents time, and the vertical axis represents q (one of the four components of q) representing the orientation. Further, in an upper portion of FIG. 13, thick lines indicating modes selected by the above methods are shown. Specifically, in the upper portion of FIG. 13, three thick lines arranged above, in the middle, and below are shown. Among the three thick lines, the lower thick line indicates the state where the mode 2 is selected, the middle thick line indicates the state where the mode 1 is selected, and the upper thick line indicates the state where the mode 0 is selected.

For example, up to a time T1, the controller is in the state where the controller is at rest, and the value of q is almost "0". Up to the time T1, the mode 2 is selected. When the controller is swung by the user at the time T1, the orientation of the controller changes, and the value of q changes as shown in FIG. 13. From the time T1 to a time T2, the controller is swung relatively slowly, and during this period, the mode 1 is selected. Further, at the time T2, for an instant, it is detected that the controller is in the state where the controller is at rest, and the mode 2 is selected. From the time T2 to a time T3, the controller is swung slowly again, and the mode 1 is selected. Next, when the controller is swung hard from the time T3 to a time T4, the orientation of the controller changes sharply. During the period from T3 to T4, the mode 0 is selected. Further, during the period from the time T4 to a time T5, the controller is swung slowly again, and the mode 1 is selected. When the controller is swung hard at the time T5, the mode 0 is selected.

As described above, in the exemplary embodiment, every time the controller and the main body apparatus 2 communicate with each other, then in accordance with the state of the controller at that time (specifically, the state determined based on an output from the inertial sensor 43), any of the plurality of modes is selected.

As described above, in the exemplary embodiment, in accordance with the state of the controller (specifically, the angular velocity values output from the inertial sensor 43 at that time), any of the plurality of modes is selected, and orientation data is compressed by a method corresponding to the selected mode. Specifically, in accordance with whether the controller is in the state where the controller is at rest, or is in the state where the orientation of the controller changes linearly, or is in neither of the states, a mode is selected.

For example, when the controller is in the state where the controller is at rest, the mode 2 is selected, and three pieces of orientation data are compressed so that the data size of one of the three pieces of orientation data is greater than the data sizes of the other pieces of orientation data, thereby generating first compressed data. Then, the generated first compressed data is transmitted to the main body apparatus 2. When the mode 2 is not selected, it is determined whether or not the controller is in the state where the orientation of the controller changes linearly. Then, when it is determined that the controller is in the state where the orientation of the controller changes linearly, the mode 1 is selected. Then, the three pieces of orientation data are compressed by a method corresponding to the mode 1.

Specifically, based on an output from the inertial sensor 43 at a first timing, the controller according to the exemplary embodiment acquires a first value (e.g., f0) regarding the orientation of the controller. Further, based on an output from the inertial sensor 43 at a second timing different from the first timing, the controller acquires a second value (e.g., f2) regarding the orientation of the controller. Then, the controller determines whether or not the first conditions (e.g., the above formulas 4 and 5) are satisfied. When it is determined that the first conditions are satisfied, the controller compresses at least one of the first value (e.g., f0) and the second value (e.g., f2) by a first method (a method in the mode 2). Further, when it is determined that the first conditions are not satisfied, the controller compresses the first value and the second value by a second method (a method in the mode 1 or a method in the mode 0) different from the first method.

As described above, the controller according to the exemplary embodiment compresses data by a method that varies depending on whether or not the first conditions are satisfied, and thereby can dynamically select an appropriate compression method and compress data regarding the orientation in accordance with the state of the controller. Specifically, data related to the first value and data related to the second value are compressed so that the amount of either one of the data related to the first value (e.g., f0 or q0) and the data related to the second value (e.g., f2 or q2) is greater than the amount of the other. In other words, pieces of data regarding the orientation are compressed so that the compression ratio of one of the pieces of data is lower than the compression ratio of the other piece of data. Consequently, it is possible to make the amount of information to be lost smaller in one of the pieces of data than in the other piece of data. Thus, it is possible to reduce the amount of data transmitted to the main body apparatus 2 as a whole, and the main body apparatus 2 can also accurately restore the orientation of the controller.

Further, when it is determined that the first conditions are not satisfied, the controller determines whether or not the second conditions (the second condition A and the second condition B) different from the first conditions are satisfied.

When it is determined that the second conditions are satisfied, the controller compresses data by the second method. In the second method, the controller compresses the data related to the first value and the data related to the second value with the same compression ratio. Further, the controller compresses data related to a third value (q1) based on an output from the inertial sensor 43 at a third timing different from the first and second timings so that the amount of the data related to the third value is smaller than the amounts of the data related to the first value and the data related to the second value. When the second conditions are satisfied, the first value, the second value, and the third value have linearity. Since these values have linearity, if the main body apparatus 2 obtains two values, the main body apparatus 2 can accurately guess the remaining one value. Thus, in this case, the controller compresses the data related to the first value and the data related to the second value with a relatively low compression ratio and compresses the data related to the third value at the third timing (more specifically, the timing between the first and second timings) with a relatively high compression ratio. Consequently, it is possible to reduce the amount of data as a whole, and the main body apparatus 2 can also accurately restore the orientation of the controller.

Further, in the exemplary embodiment, based on the angular velocity values, the controller calculates the orientation of the controller and transmits the calculated orientation to the main body apparatus 2. Thus, even when a packet from the controller to the main body apparatus 2 is lost, it is possible to reduce an error. For example, when the angular velocity values detected by the inertial sensor 43 are transmitted from the controller to the main body apparatus 2, the main body apparatus integrates the received angular velocity values, thereby calculating the orientation of the controller. In this case, if a packet is lost, the main body apparatus cannot calculate the orientation of the controller. Thus, every time a packet is lost, an error is accumulated. In contrast, in a case where the controller calculates the orientation and transmits the calculated orientation to the main body apparatus 2 as in the above exemplary embodiment, even when a packet is lost, an error is not accumulated. The main body apparatus 2 receives the orientation calculated by the controller, whereby, even when a packet is lost, the main body apparatus 2 can know the accurate orientation of the controller at the time when the main body apparatus 2 receives the packet.

Further, in the exemplary embodiment, compressed data transmitted from the controller to the main body apparatus 2 includes time information. Thus, even if a packet is lost, the main body apparatus 2 can accurately know time information of the time when the controller calculates the orientation.

Further, in the exemplary embodiment, based on the angular velocity values sampled at 800 Hz, the controller calculates the orientation and transmits the calculated orientation to the main body apparatus 2 at 200 Hz. Consequently, without increasing the frequency of the communication between the main body apparatus 2 and the controller, the main body apparatus 2 can acquire the orientation of the controller with higher accuracy than when the main body apparatus calculates the orientation. For example, a case is assumed where the sampling frequency of the angular velocity values is 800 Hz, and the frequency of the communication between the main body apparatus 2 and the controller is 200 Hz. In this case, when the angular velocity values from the inertial sensor 43 are transmitted to the main body apparatus 2, and the main body apparatus calculates the orientation, it is possible that the controller transmits one of the four angular velocity values sampled at 800 Hz to the main body apparatus 2, or averages four angular velocity values sampled at 800 Hz and transmits the average to the main body apparatus 2. In either case, the orientation is calculated at 200 Hz. Thus, there are some limitations to the accuracy of the orientation of the controller calculated by the main body apparatus. On the other hand, in the exemplary embodiment, since the controller calculates the orientation at 800 Hz, the main body apparatus can acquire the orientation of the controller with high accuracy.

(Variations)

While the compression methods for compressing orientation data according to the exemplary embodiment have been described, the above exemplary embodiment may be modified as follows.

For example, in the above exemplary embodiment, the first value acquired based on an output from the inertial sensor 43 at the first timing is the quaternion q0 (or f0) representing the orientation of the controller and calculated based on the angular velocity values from the inertial sensor 43. The first value may be the angular velocity values themselves output from the inertial sensor 43. The same applies to the second value acquired based on an output from the inertial sensor 43 at the second timing, and the third value acquired based on an output from the inertial sensor 43 at the third timing.

Further, in the above exemplary embodiment, based on the vector f having three of the four components of the quaternion q representing the orientation of the controller, it is determined whether or not the first conditions or the second conditions are satisfied, and a mode is selected. Then, f is compressed in the selected mode and transmitted from the controller to the main body apparatus 2. In another exemplary embodiment, based on q having four components, it may be determined whether or not the first conditions or the second conditions are satisfied, and q may be compressed in the selected mode and transmitted from the controller to the main body apparatus 2. Further, conditions for selecting a mode may be determined based on q, and f may be compressed and transmitted in the selected mode.

Further, in the above exemplary embodiment, the orientation of the controller is represented as q (a vector having three components representing the axis of rotation and a single component representing the angle of rotation). Alternatively, in another exemplary embodiment, the orientation of the controller may be represented in another form. For example, the orientation of the controller may be represented using the Euler angles, and orientation data regarding the orientation represented using the Euler angles may be compressed by a method corresponding to any of the plurality of modes described above and transmitted to the main body apparatus 2.

Further, in the above exemplary embodiment, based on a value acquired first (f0), a value acquired second (f1), and a value acquired third (f2), $\Delta f1$ is calculated (the above formula 6). Then, $\Delta f1$ is used to determine each mode. For example, to determine whether or not f0, f1, and f2 have linearity (to determine whether or not the second condition B is satisfied), it is determined whether or not each component of $\Delta f1$ is within a predetermined range. In another exemplary embodiment, by another method, it may be determined whether or not f0, f1, and f2 have linearity.

"Linearity" as used herein refers to the state where the value acquired first (f0), the value acquired second (f1), and the value acquired third (f2) increase or decrease at almost constant rates. For example, when f representing the orientation has x, y, and z-axis components, each of the values of the x, y, and z-axis components increases or decreases at a constant rate. Without even using the above formula 6, it is possible to determine whether or not these values have linearity. For example, the determination can be made based on whether or not the distance between a straight line connecting the value acquired first (the value of each component of f0) and the value acquired second (the value of each component of f1), and the value acquired third (the value of each component of f2) is less than a predetermined value.

Further, in the above exemplary embodiment, the first conditions for selecting the mode 2 are that the above formulas 4 and 5 hold. The first conditions, however, are not limited to this. For example, based on the comparison between the first value (f0) and the second value (f2), it may be determined whether or not the first condition A is satisfied. Further, when the amount of change in the orientation of the controller is less than a predetermined value, it may be determined that the first conditions are satisfied. Not only by formula 4 but also by another method, it may be determined whether or not the amount of change in the orientation of the controller is less than a predetermined value. For example, when the absolute values of the acquired angular velocity values about the respective axes are less than a predetermined value (0 or an extremely small value), it may be determined that the first conditions are satisfied. In this case, based on the angular velocity values output from the inertial sensor 43 at a certain time, it is possible to determine whether or not the first conditions are satisfied. That is, in the above exemplary embodiment, based on outputs from the inertial sensor 43 at at least both the first timing and the second timing, it is determined whether or not the first conditions are satisfied. Alternatively, in another exemplary embodiment, based on an output from the inertial sensor 43 at at least one of the first timing and the second timing, it may be determined whether or not the first conditions are satisfied.

For example, when the orientation of the controller at a certain time is calculated, and when the angular velocity values regarding three axes from the inertial sensor 43 acquired after that are almost "0", it is possible to determine that the controller is almost at rest. Thus, not based on formulas 4 and 5 but based on the angular velocity values from the inertial sensor 43, the controller can determine whether or not the mode 2 is applicable.

Further, the first conditions for selecting the mode 2 may be not only that the controller is in the state where the controller is at rest, but also that the state of the controller is a predetermined state.

Further, the second conditions for selecting the mode 1 may be any conditions for determining whether or not the orientation of the controller changes linearly. Not only by the above method but also by another method, it is possible to determine whether or not the orientation of the controller changes linearly. For example, when the differences between the angular velocity values of the respective axes from the inertial sensor 43 at a certain timing and the angular velocity values of the respective axes from the inertial sensor 43 at the next timing are "0" or within a predetermined range, it is possible to determine that the orientation of the controller changes at constant rates, and it is possible to determine that the orientation of the controller changes linearly.

Further, in the above exemplary embodiment, in accordance with the state of the controller determined based on the inertial sensor 43, any of the plurality of modes is selected. In another exemplary embodiment, in accordance with the state of the controller determined based on other than an output from the inertial sensor 43, any of the plurality of modes may be selected. For example, based on an image from a camera, the state of the controller may be determined, and in accordance with the determined state of the controller, any of the plurality of modes may be selected.

Further, in the above exemplary embodiment, when the mode 2 is selected, f2 is compressed to 24 bits, the difference between f2 and f0 is calculated as $\Delta$f0, $\Delta$f0 is compressed to 13 bits, $\Delta$f1 (the above formula 6) is further calculated, and $\Delta$f1 is compressed to 4 bits. The compression method when the mode 2 is selected is merely an example, and the size of each piece of data after being compressed is not limited to this. Further, when the mode 2 is selected, the three pieces of data may be compressed by another compression method. For example, f2 may be represented by 32 bits without being compressed, and $\Delta$f0 and/or $\Delta$f1 may be compressed to a smaller number of bits than the above. Further, when the mode 2 is selected, for example, f0 may be compressed to 24 bits (or f0 may not be compressed), $\Delta$f2, which is the difference between f0 and f2, may be compressed to 13 bits (or a smaller number of bits than this), and $\Delta$f1 may be compressed to 4 bits (or a smaller number of bits than this). Then, these pieces of compressed data including f0, $\Delta$f1, and $\Delta$f2 may be transmitted to the main body apparatus 2. Further, f0 and f1 may be compressed without calculating $\Delta$f0 and $\Delta$f1. That is, when the mode 2 is selected, these three pieces of data may be compressed so that the amount of one of the pieces of data f0, f1, and f2 is greater than the amount of the other pieces of data.

Further, in the above exemplary embodiment, when the mode 1 is selected, f0 and f2 are compressed to 16 bits, and $\Delta$f1 is compressed to 8 bits. The compression method when the mode 1 is selected is merely an example, and the size of each piece of data after being compressed is not limited to this. Further, when the mode 1 is selected, the three pieces of data may be compressed by another compression method. For example, f0 and f1 may be compressed to 16 bits, $\Delta$f2 may be calculated, and $\Delta$f2 may be compressed to 8 bits. $\Delta$f2 may be data calculated based on f0, f1, and f2 and representing, for example, the difference between the value of f2 guessed based on the linearity of f0 and f1, and f2 actually calculated based on the angular velocity values. Then, the pieces of compressed data including f0, f1, and $\Delta$f2 may be transmitted to the main body apparatus 2.

Further, in the above exemplary embodiment, when the mode 2 or the mode 1 is selected, the difference between the average of f0 and f2, and f1 is calculated as $\Delta$f1, and the calculated difference $\Delta$f1 is compressed and transmitted to the main body apparatus 2. In another exemplary embodiment, based not only on the average of f0 and f2 but also on at least two of f0 (or q0), f1 (or q1), and f2 (or q2), a predetermined reference value may be calculated. Then, based on the calculated reference value, a piece of data related to at least one of f0 (or q0), f1 (or q1), and f2 (or q2) may be set, and the at least one piece of data may be compressed. For example, a value indicating how far f0, f1, and f2 are from the calculated reference value may be set, and data indicating the set value may be compressed and transmitted to the main body apparatus 2.

Further, in the above exemplary embodiment, based on data acquired first (f0), data acquired second (f1), and data acquired third (f2), it is determined which of the modes 0 to 2 is to be selected, and these three pieces of data are compressed in the mode corresponding to the result of the determination and transmitted to the main body apparatus 2. In another exemplary embodiment, based on two pieces of data, it may be determined which of the modes 0 to 2 is to be selected, and the two pieces of data may be compressed and transmitted.

Further, in another exemplary embodiment, the plurality of modes are not limited to three, and may be two or four or more.

Further, in the above exemplary embodiment, based on the angular velocity values from the inertial sensor, the controller calculates a value regarding the orientation of the controller, selects a mode in accordance with the state of the controller, compresses data regarding the orientation by a method corresponding to the mode, and transmits the data. In another exemplary embodiment, based on the acceleration values from the inertial sensor, a value regarding the position of the controller (the amount of movement in each axial direction) may be calculated, a mode may be selected in accordance with the state of the controller, and data regarding the position may be compressed by a method corresponding to the mode and transmitted. The controller integrates the acceleration values from the inertial sensor, thereby calculating the velocity in each axial direction of the controller. Thus, the controller can calculate the position (the amount of movement) in each axial direction from the calculated velocity. In this case, q and f representing the orientation described above are replaced with a vector representing the position, and the conditions (the first condition A, the first condition B, the second condition A, and the second condition B) for selecting a mode are also determined based on the vector representing the position.

Further, in the above exemplary embodiment, when the controller and the main body apparatus 2 are wirelessly connected together, a mode is selected in accordance with the state of the controller, and data regarding the orientation of the controller is compressed by a compression method corresponding to the selected mode and transmitted to the main body apparatus 2. The mode may be selected and the data may be compressed in accordance with the selected mode when the controller and the main body apparatus 2 are connected together in a wired manner (i.e., when the controller is attached to the main body apparatus 2).

Further, in the above exemplary embodiment, the controller compresses data regarding the orientation and transmits the data to the main body apparatus. In another exemplary embodiment, not only the controller but also another optional apparatus may select a mode, compress data as described above, and transmit the data to another apparatus. For example, an optional apparatus such as a smartphone, a tablet terminal, a laptop personal computer, a wearable terminal, or a sensor may select a mode, compress data as described above, and transmit the data to another apparatus.

Further, the above exemplary embodiment is based on the premise that the controller and the main body apparatus 2 are locally connected together. Alternatively, in another exemplary embodiment, an optional apparatus such as a controller and another apparatus may be remotely connected together. The optional apparatus may select a mode, compress data corresponding to the selected mode as described above, and transmit the compressed data to another apparatus via the Internet, for example.

While the exemplary embodiment has been described, the above description is merely illustrative, and the exemplary embodiment may be improved and modified in various manners.

While certain example systems, methods, devices and apparatuses have been described herein, it is to be understood that the appended claims are not to be limited to the systems, methods, devices and apparatuses disclosed, but on the contrary, are intended to cover various modifications and equivalent arrangements included within the spirit and scope of the appended claims.

What is claimed is:

1. An information processing apparatus including an inertial sensor, the information processing apparatus comprising at least one processor configured to at least:
    based on an output from the inertial sensor at a first timing, acquire a first value regarding an orientation or a position of the information processing apparatus;
    based on an output from the inertial sensor at a second timing different from the first timing, acquire a second value regarding the orientation or the position of the information processing apparatus;
    when the information processing apparatus is at rest, generate first data from at least one of the first value and the second value by a first method; and
    when the information processing apparatus is not at rest, generate second data from at least one of the first value and the second value by a second method different from the first method.

2. The information processing apparatus according to claim 1, wherein the at least one processor is further configured to transmit the first data or the second data to another apparatus.

3. The information processing apparatus according to claim 1, wherein:
    the at least one processor is further configured to, based on at least one of the first value and the second value, determine whether or not a first condition is satisfied, and when it is determined that the first condition is satisfied, generate the first value by the first method, and when it is determined that the first condition is not satisfied, generate the second value by the second method, and
    the first condition is a condition satisfied when the information processing apparatus is at rest.

4. The information processing apparatus according to claim 1, wherein when an amount of change in the orientation or the position of the information processing apparatus is less than a predetermined value, the first data is generated by the first method, and when the amount of change in the orientation or the position of the information processing apparatus is greater than or equal to the predetermined value, the second data is generated by the second method.

5. The information processing apparatus according to claim 1, wherein:
    the first data is data obtained by compressing at least one of the first value and the second value by the first method, and
    the second data is data obtained by compressing at least one of the first value and the second value by the second method.

6. The information processing apparatus according to claim 1, wherein:
    the first data includes data related to the first value and data related to the second value, and
    when the information processing apparatus is at rest, the first data is generated so that the data related to the second value is larger in size than the data related to the first value.

7. The information processing apparatus according to claim 1, wherein:
    the first data includes data related to the first value and data related to the second value, the second data includes data related to the first value and data related to the second value, and the data related to the second value included in the first data when the information processing apparatus is at rest is larger in size than the data related to the second value included in the second data when the information processing apparatus is not at rest.

8. An information processing method performed by an information processing apparatus including an inertial sensor, the information processing method comprising:

based on an output from the inertial sensor at a first timing, acquiring a first value regarding an orientation or a position of the information processing apparatus;

based on an output from the inertial sensor at a second timing different from the first timing, acquiring a second value regarding the orientation or the position of the information processing apparatus;

when the information processing apparatus is at rest, generating first data from at least one of the first value and the second value by a first method; and when the information processing apparatus is not at rest, generating second data from at least one of the first value and the second value by a second method different from the first method.

9. The information processing method according to claim 8, further comprising transmitting the first data or the second data to another apparatus.

10. The information processing method according to claim 8, further comprising based on at least one of the first value and the second value, determining whether or not a first condition is satisfied, and when it is determined that the first condition is satisfied, generating the first value by the first method, and when it is determined that the first condition is not satisfied, generating the second value by the second method, and wherein the first condition is a condition satisfied when the information processing apparatus is at rest.

11. The information processing method according to claim 8, wherein when an amount of change in the orientation or the position of the information processing apparatus is less than a predetermined value, the first data is generated by the first method, and when the amount of change in the orientation or the position of the information processing apparatus is greater than or equal to the predetermined value, the second data is generated by the second method.

12. The information processing method according to claim 8, wherein:

the first data is data obtained by compressing at least one of the first value and the second value by the first method, and the second data is data obtained by compressing at least one of the first value and the second value by the second method.

13. The information processing method according to claim 8, wherein:

the first data includes data related to the first value and data related to the second value, and when the information processing apparatus is at rest, the first data is generated so that the data related to the second value is larger in size than the data related to the first value.

14. The information processing method according to claim 8, wherein:

the first data includes data related to the first value and data related to the second value, the second data includes data related to the first value and data related to the second value, and the data related to the second value included in the first data when the information processing apparatus is at rest is larger in size than the data related to the second value included in the second data when the information processing apparatus is not at rest.

15. A non-transitory computer readable storage medium storing instructions that, when executed by a processor of an information processing apparatus, perform the information processing method according to claim 8.

16. An information processing system including a first apparatus including an inertial sensor and a second apparatus for communicating with the first apparatus, the first apparatus being configured to at least:

based on an output from the inertial sensor at a first timing, acquire a first value regarding an orientation or a position of the first apparatus;

based on an output from the inertial sensor at a second timing different from the first timing, acquire a second value regarding the orientation or the position of the first apparatus;

when the first apparatus is at rest, generate first data from at least one of the first value and the second value by a first method; and when the first apparatus is not at rest, generate second data from at least one of the first value and the second value by a second method different from the first method; and transmit the first data or the second data to the second apparatus, and the second apparatus being configured to at least receive the transmitted first data or second data.

17. The information processing system according to claim 16, wherein:

the first data is data obtained by compressing at least one of the first value and the second value by the first method, and the second data is data obtained by compressing at least one of the first value and the second value by the second method.

18. The information processing system according to claim 16, wherein:

the first data includes data related to the first value and data related to the second value, and when the first apparatus is at rest, the first data is generated so that the data related to the second value is larger in size than the data related to the first value.

19. The information processing system according to claim 16, wherein:

the first data includes data related to the first value and data related to the second value, the second data includes data related to the first value and data related to the second value, and the data related to the second value included in the first data when the first apparatus is at rest is larger in size than the data related to the second value included in the second data when the first apparatus is not at rest.

20. An information processing apparatus including an inertial sensor, the information processing apparatus comprising at least one processor configured to at least:

based on an output from the inertial sensor at a first timing, acquire a first value regarding an orientation or a position of the information processing apparatus;

based on an output from the inertial sensor at a second timing different from the first timing, acquire a second value regarding the orientation or the position of the information processing apparatus;

when the information processing apparatus is moving and the movement of the information processing apparatus is a first movement, generate first data from at least one of the first value and the second value by a first method; and when the information processing apparatus is moving and the movement of the information processing apparatus is a second movement different from the first movement, generate second data from at least one of the first value and the second value by a second method different from the first method.

* * * * *